(12) United States Patent
Tanizaki et al.

(10) Patent No.: US 6,842,366 B2
(45) Date of Patent: Jan. 11, 2005

(54) THIN FILM MAGNETIC MEMORY DEVICE EXECUTING SELF-REFERENCE TYPE DATA READ

(75) Inventors: Hiroaki Tanizaki, Hyogo (JP); Tsukasa Ooishi, Hyogo (JP); Hideto Hidaka, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 140 days.

(21) Appl. No.: 10/383,570

(22) Filed: Mar. 10, 2003

(65) Prior Publication Data

US 2004/0047179 A1 Mar. 11, 2004

(30) Foreign Application Priority Data

Sep. 9, 2002 (JP) .................................. 2002-263112

(51) Int. Cl.[7] .............................................. G11C 11/14
(52) U.S. Cl. ............. 365/171; 365/189.01; 365/189.04; 365/189.07; 365/209
(58) Field of Search ........................... 365/171, 189.01, 365/189.04, 189.07, 209

(56) References Cited

U.S. PATENT DOCUMENTS 5,943,286 A * 8/1999 Orita ..................... 365/230.03
6,055,178 A * 4/2000 Naji ............................ 365/158
6,317,376 B1 11/2001 Tran et al.

FOREIGN PATENT DOCUMENTS

JP 2000-163950 6/2000

* cited by examiner

*Primary Examiner*—Connie C. Yoha
(74) *Attorney, Agent, or Firm*—Burns, Doane, Swecker & Mathis, L.L.P.

(57) ABSTRACT

In one data read operation, data read for reading stored data before and after a predetermined data write magnetic field is applied to a selected memory cell, respectively, is executed, and the data read is executed in accordance with comparison of voltage levels corresponding to the data read operations before and after application of the predetermined data write magnetic field. In addition, data read operations before and after the application of a data write magnetic field are executed using read modify write. It is thereby possible to avoid an influence of an offset or the like resulting from manufacturing irregularities in respective circuits forming a data read path, to improve efficiency of the data read operation with accuracy and to execute a high rate data read operation.

16 Claims, 19 Drawing Sheets

THIN FILM MAGNETIC MEMORY DEVICE EXECUTING SELF-REFERENCE TYPE DATA READ

BACKGROUND OF THE INVENTION

1. Field of the Invention

The present invention relates to a thin film magnetic memory device, and more particularly to a random access memory including memory cells having magnetic tunnel junctions (MTJ).

2. Description of the Background Art

Attention has been paid to an MRAM (Magnetic Random Access Memory) device as a memory capable of storing data in a nonvolatile manner with low power consumption. MRAM device is a memory which stores nonvolatile data using a plurality of thin film magnetic materials formed on a semiconductor integrated circuit, and which can randomly access the respective thin film magnetic materials.

Recently, it is particularly made public that the performance of MRAM device surprisingly develops by employing thin film magnetic materials utilizing magnetic tunnel junctions as memory cells.

FIG. 21 is a schematic diagram showing the configuration of a memory cell having a tunnel junction (also simply referred to as "MTJ memory cell" hereinafter).

Referring to FIG. 21, the MTJ memory cell includes a tunnel magneto-resistance element TMR the electric resistance of which changes according to the data level of magnetically written, stored data, and an access transistor ATR. Access transistor ATR is coupled in series to tunnel magneto-resistance element TMR between a bit line BL and a source line SL. A field effect transistor formed on a semiconductor substrate is typically employed as access transistor ATR.

Relative to the MTJ memory cell, bit line BL and write digit line WDL for supplying data write currents in different directions during data write, respectively, and word line WL for instructing data read, are provided. If data is to be read, tunnel magneto-resistance element TMR is electrically coupled between bit line BL and source line SL the voltage of which is set at a fixed voltage Vss when access transistor ATR is turned on.

FIG. 22 is a conceptual view for describing a data write operation for writing data to an MTJ memory cell.

Referring to FIG. 22, tunnel magneto-resistance element TMR includes a fixed ferromagnetic body layer having a constant magnetic direction (also simply referred to as "fixed magnetic layer" hereinafter) FL, and a ferromagnetic body layer magnetized in a direction to a magnetic field applied from the outside (to be also simply referred to as "free magnetic layer" hereinafter) VL. A tunneling barrier (tunneling film) TB formed out of an insulator film is provided between fixed magnetization layer FL and free magnetization layer VL. Free magnetic layer VL is magnetized in a direction equal to or opposite (nonparallel) to the magnetic direction of fixed magnetic layer FL, depending on the level of written stored data. Fixed magnetic layer FL, tunneling barrier TB and free magnetic layer VL form a magnetic tunnel junction.

The electric resistance of tunnel magneto-resistance element TMR changes according to the relative relationship in magnetic direction between fixed magnetic layer FL and free magnetic layer VL. Specifically, the electric resistance of magneto-resistance element TMR becomes a minimum Rmin if the magnetic direction of fixed magnetic layer FL is parallel to that of free magnetic layer VL, and becomes a maximum Rmax if the magnetic direction of fixed magnetic layer FL is opposite (nonparallel) to that of free magnetic layer VL.

If data is to be written, word line WL is deactivated and access transistor ATR is turned off. In this state, data write currents (±Iw) for magnetizing free magnetic layer VL are carried to bit line BL and write digit line WDL in directions according to the level of written data, respectively.

FIG. 23 is a conceptual view showing the relationship between a data write current and the magnetic direction of a tunnel magneto-resistance element during data write.

Referring to FIG. 23, the horizontal axis H(EA) indicates a magnetic field applied to free magnetic layer VL in tunnel magneto-resistance element TMR in an easy axis (EA: Easy Axis) direction, and the vertical axis H(HA) indicates a magnetic field acting on free magnetic layer VL in a hard axis (HA: Hard Axis) direction. Magnetic fields H(EA) and H(HA) correspond to two magnetic fields generated by currents carried to bit line BL and write digit line WDL, respectively.

In the MTJ memory cell, the magnetic direction in which fixed magnetic layer FL is fixed is along the easy axis of free magnetic layer VL, and free magnetic layer VL is magnetized in a direction parallel or nonparallel (opposite) to the magnetic direction of fixed magnetic layer FL along the easy axis direction, depending on the level ("1" or "0") of stored data, respectively. The MTJ memory cell can store 1-bit data ("1" or "0") to correspond to one of the two magnetic directions of free magnetic layer VL.

The magnetic direction of free magnetic layer VL is newly rewritten only in the case where the sum of magnetic fields H(EA) and H(HA) to be applied reaches the outer region of an asteroid characteristic line shown in the figure. More specifically, in the case where the applied data write magnetic field has intensity corresponding to the inner region of the asteroid characteristic line, the magnetic direction of free magnetic layer VL does not change.

As indicated by an asteroid characteristic line, it is possible to decrease a magnetization threshold value necessary to change the magnetic direction along the easy axis by applying a magnetic field to free magnetic layer VL in the hard axis direction.

If operating points during data write are designed as shown in FIG. 23, the data write magnetic field in the easy axis direction in the MTJ memory cell to which data is written is designed to have an intensity of $H_{WR}$. In other words, a data write current carried to bit line BL or write digit line WDL is designed so as to obtain data write magnetic field $H_{WR}$. Normally, data write magnetic field $H_{WR}$ is expressed as a sum of a switching magnetic field $H_{SW}$ necessary to change the magnetic direction and a margin $\Delta H$. That is, $H_{WR}=H_{SW}+\Delta H$.

To rewrite the stored data of the MTJ memory cell, i.e., to change the magnetic direction of tunnel magneto-resistance element TMR, it is necessary to carry a data write current equal to or higher than predetermined level to both write digit line WDL and bit line BL. By doing so, free magnetic layer VL in tunnel magneto-resistance element TMR is magnetized in a direction parallel or opposite (nonparallel) to the magnetic direction of fixed magnetic layer FL in accordance with the direction of the data write magnetic field along the easy axis (EA). The magnetic direction, i.e., the stored data of the MTJ memory cell which is once written to tunnel magneto-resistance element TMR is kept nonvolatile until new data is written.

FIG. 24 is a conceptual view for describing a data read operation for reading data from an MTJ memory cell.

Referring to FIG. 24, if data is to be read, access transistor ATR is turned on in response to the activation of word line WL. In addition, the voltage of bit line BL is fixed to fixed voltage Vss. As a result, tunnel magneto-resistance element TMR is electrically coupled to bit line BL while the voltage of TMR is pulled down to fixed voltage Vss.

In this state, if the voltage of bit line BL is pulled up to a predetermined voltage, a memory cell current Icell according to the electric resistance of tunnel magneto-resistance element TMR, i.e., the stored data of the MTJ memory cell passes through a current path including bit line BL and tunnel magneto-resistance element TMR. By comparing memory cell current Icell with, for example, a predetermined reference current, it is possible to read the stored data from the MTJ memory cell.

In this way, the electric resistance of tunnel magneto-resistance element TMR changes according to the applied data write magnetic field, i.e., rewritable magnetic direction. Due to this, electric resistances Rmax/Rmin of tunnel magneto-resistance element TMR are made correspond to the level ("1"/"0") of the stored data, respectively, whereby it is possible to execute nonvolatile data storage.

FIG. 25 is a block diagram of an MTJ memory cell employing above-described access transistor ATR.

Referring to FIG. 25, access transistor ATR formed on a semiconductor substrate SUB includes source/drain regions 310 and 320 which are n type regions, and a gate region. Word line WL which serves as the gate of access transistor ATR is formed on an upper layer of a p type gate region. Write digit line WDL is arranged on an upper layer of source/drain region 310. Tunnel magneto-resistance element TMR is arranged on an layer of write digit line WDL. Tunnel magneto-resistance element TMR is electrically coupled to source/drain region 320 of access transistor ATR through a metallic film formed in a contact hole. Bit line BL is electrically coupled to tunnel magneto-resistance element TMR, and provided on an upper layer of tunnel magneto-resistance element TMR.

Further, as the MTJ memory cell used to store data, a memory cell which uses a diode element as an access element in place of access transistor ATR can be employed.

FIG. 26 is a block diagram showing the configuration of an MTJ memory cell which uses a diode element as an access element.

Referring to FIG. 26, a memory cell using a diode element as an access element, includes tunnel magneto-resistance element TMR and access diode DY. Access diode DY has an anode electrically coupled to magneto-resistance element TMR and a cathode electrically coupled to source line SL. Bit line BL is provided in a direction in which bit line BL intersects with source line SL, and coupled to tunnel magneto-resistance element TMR. A data write operation for writing data to the memory cell is carried out by supplying data write currents to both source line SL and bit line BL, respectively. The directions of the data write currents are set according to the data level of written data as in the case of the memory cell using the access transistor.

If data is to be read, source line SL corresponding to a selected memory cell is set to have low voltage (e.g., a ground voltage GND). At this time, by precharging bit line BL with high voltage (e.g., a power supply voltage Vcc), access diode DY is biased in a forward direction to become conductive, and memory cell current Icell passes through tunnel magneto-resistance element TMR. In this way, even if the MTJ memory cell uses the access diode, it is possible to execute data read and data write operations.

FIG. 27 is a block diagram of an MTJ memory cell which uses above-described access diode DY.

Referring to FIG. 27, access diode DY is formed on an upper layer of source line SL. Tunnel magneto-resistance element TMR is formed on an upper layer of access diode DY and electrically coupled to bit line BL. In access diode DY, a p type region and an n type region are formed so that the anode of access diode DY is electrically coupled to tunnel magneto-resistance element TMR and the cathode thereof is electrically coupled to source line SL. Accordingly, the MTJ memory cell using this access diode DY has an advantage in that the layout area of this MTJ memory cell is smaller than that of the MTJ memory cell which uses access transistor ATR described above.

As can be seen, it is possible to execute data storage using various types of MTJ memory cells in a MRAM device.

Meanwhile, an MRAM device normally includes not only MTJ memory cells for executing data storage but also a reference cell for generating a reference current to be compared with memory cell current Icell. It is necessary to set the reference current generated by the reference cell to be the intermediate value of two memory cell currents Icell corresponding to two electric resistances Rmax and Rmin of each MTJ memory cell, respectively. Basically, this reference cell is designed to include same tunnel magneto-resistance element as that used in the MTJ memory cell.

A pass current which passes through tunnel magneto-resistance element TMR is largely influenced by the thickness of the insulating film used as the tunneling film. Due to this, the thickness of the tunneling film of the MTJ memory cell differs from that of the tunneling film of the reference cell, the reference current cannot be set at desired level. Further, since the tunneling film is designed to be thin, only low voltage level, e.g., a voltage equal to or lower than about 0.5 V can be applied to the tunneling film. However, the reference cell using access diode DY operates in a built potential voltage region at 0.5 V. As a result, the pass current may possibly greatly change in response to even a small fluctuation in voltage. For this reason, it is difficult to accurately set the level of the reference current generated by the reference cell and there is a fear of the deterioration of data read accuracy due to the fluctuation in reference current.

In case of ordinary MTJ memory cell, in particular, a resistance difference ΔR which is generated according to the level of the stored data is not so large. Typically, electric resistance Rmin is within about several tens of percentage of electric resistance Rmax. Due to this, the change of memory cell Icell according to the level of the stored data is not so large and limited in the order of microamperes ($\mu$A: $10^{-6}$ A). It is, therefore, necessary to improve the accuracy of steps of manufacturing the tunneling film of an MTJ memory cell and that of a reference cell.

However, if tunnel thickness accuracy is set strict in manufacturing process, it is considered that manufacturing cost hike accompanying the deterioration of manufacturing yield may occur. In this background, it is demanded to provide the configuration of an MRAM device which executes a data read operation with high accuracy on the basis of resistance difference ΔR of an MTJ memory cell without making manufacturing steps too strict.

To solve these disadvantages, the configuration of an MRAM device which executes a data read operation only by accessing a selected memory cell without using a reference cell, i.e., executes so-called "self-reference" data read is disclosed by U.S. Pat. No. 6,317,376 B1.

According to the conventional self-reference read disclosed by the U.S. Pat. No. 6,317,376 B1, one data read operation consists of (1) an operation for reading stored data from a selected memory cell, (2) that for reading data after forcedly writing "0" data to the selected memory cell, (3) that for reading data after forcedly writing "1" data to the selected memory cell, (4) that for generating read data on the basis of the read results of (1) to (3), and that for rewriting (restoring) read data to the selected memory cell, which operations are continuously executed. By performing such a data read operation, data read can be executed only by accessing the selected memory cell. Therefore, it is possible to execute high accuracy data read without being influenced by manufacturing irregularities of the reference cells.

Nevertheless, according to the conventional self-reference read, it is necessary to repeatedly execute forced data write and data read in one data read operation. Due to this, it takes disadvantageously long time from the start of the data read until the completion of the data read, and the acceleration of the data read operation is disadvantageously prevented.

SUMMARY OF THE INVENTION

The present invention has been made to solve the above-described disadvantages. It is an object of the present invention to provide a configuration of a thin film magnetic memory device which executes data read with high accuracy at high rate on the basis of a self-reference method.

It is another object of the present invention to provide a configuration of a thin film magnetic memory device which executes data read on the basis of a self-reference method by using various MTJ memory cells.

A thin film magnetic memory device according to the present invention includes a plurality of memory cells, a data line, a current supply circuit, a data write circuit and a data read circuit. Each of the plurality of memory cells has an electric resistance according to a magnetic direction. The data line is electrically coupled to a fixed voltage through the memory cell selected as a data read target memory cell among the plurality of memory cells during data read. The current supply circuit couples the data line to a predetermined voltage and supplies a data read current to the selected memory cell at least during the data read. The data write circuit applies a data write magnetic field to the selected memory cell. The data read circuit generates read data on the basis of stored data of the selected memory cell both before and after the data write magnetic field is applied, application of the data write magnetic field being executed at least once within one data read operation. The data read circuit includes a voltage holding section and a voltage comparison section. The voltage holding section holds a voltage of the data line applied by reading data from the selected memory cell before the data write magnetic field is applied, in an internal node. The voltage comparison section generates the read data in accordance with comparison between the voltage of the data line applied by reading the data from the selected memory cell after predetermined the data write magnetic field is applied, and a voltage of the internal node. The data read before the data write magnetic field is applied, the application of the data write magnetic field, and the data read after the data write magnetic field is applied, are continuously executed.

The thin film magnetic memory device generates the read data on the basis of the difference between the voltage of the data line of the selected memory cell before the application of the data write magnetic field and the voltage of the data line of the selected memory cell after the application of a predetermined data write magnetic field. The data read before the application, the application of the data write magnetic field, and the data read after the application, are continuously executed. So-called read modify write for continuously executing read and write when executing the data read by self-reference cell method which does not employ a reference cell, is used. Therefore, it is possible to execute a high data read operation.

A thin film magnetic memory device according to another aspect of the present invention includes a plurality of memory cells, a plurality of source lines, a plurality of bit lines, a current supply circuit, a data write circuit and a data read circuit. The plurality of memory cells are arranged in a matrix, and each includes a magneto-resistance element having an electric resistance according to a magnetic direction. The plurality of source lines is provided to correspond to rows of the memory cells, respectively. The plurality of bit lines are provided to correspond to columns of the memory cells, respectively. Each of the memory cells is arranged between the corresponding source line and the corresponding bit line without using an access element. The data line is electrically coupled to the bit line corresponding to the memory cell selected as a data read target memory cell from among the plurality of memory cells during data read. The current supply circuit couples the source line corresponding to the selected memory cell to a predetermined voltage and couples the other source lines to a fixed voltage other than the predetermined voltage during the data read. The data write circuit applies a data write magnetic field to the selected memory cell. The data read circuit generates read data according to stored data of the selected memory cell both before and after the data write magnetic field is applied, application of the data write magnetic field being executed at least once within one data read operation. Further, the data read circuit includes a voltage holding section and a voltage comparison section. The voltage holding section holds a voltage of the data line applied by reading data from the selected memory cell before the data write magnetic field is applied, in an internal node. The voltage comparison section generates the read data in accordance with comparison between the voltage of the data line applied by reading the data from the selected memory cell after predetermined the data write magnetic field is applied, and a voltage of the internal node.

The thin film magnetic memory device executes the so-called self-reference read operation using the memory cell consisting only of a magneto-resistance element without an access element. This simplifies the structure of the memory cell, making it possible to reduce the area of the memory array.

A thin film magnetic memory device according to still another aspect of the present invention includes a plurality of memory cells, a plurality of source lines, a plurality of bit lines, a data line, a current supply circuit, a bias magnetic field application section and a data read circuit. The plurality of memory cells are arranged in a matrix, each memory cell is magnetized along an easy axis in a direction according to magnetically written, stored data, and each includes a magneto-resistance element having an electric resistance according to a magnetic direction. The plurality of source lines are provided to correspond to rows of the memory cells, respectively. The plurality of bit lines are provided to correspond to columns of the memory cells, respectively. Each of the memory cells is arranged between the corresponding source line and the corresponding bit line without using an access element. The data line is electrically coupled to the bit line corresponding to the memory cell selected as a data read target memory cell from among the plurality of memory cells during data read. The current supply circuit couples the source line corresponding to the selected memory cell to a predetermined voltage and couples the other source lines to a fixed voltage other than the predetermined voltage during the data read. The bias magnetic field application section applies a bias magnetic field along a hard axis, to the selected memory cell. The data read circuit generates read data according to stored data of the selected memory cell during the data read on the basis of voltages of the data line before and after the bias magnetic field is applied, respectively.

According to the thin film magnetic memory device, the memory cell consists only of a magneto-resistance element without an access element. Using the fact that the electric resistance of the selected memory cell is changed with a polarity according to the stored data by applying the bias magnetic field along the hard axis, the self-reference data read for accessing only the selected memory cell can be executed without executing forced data write and data read and the rewriting of the stored data to the selected memory cell. It is thereby possible to execute a high rate data read operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
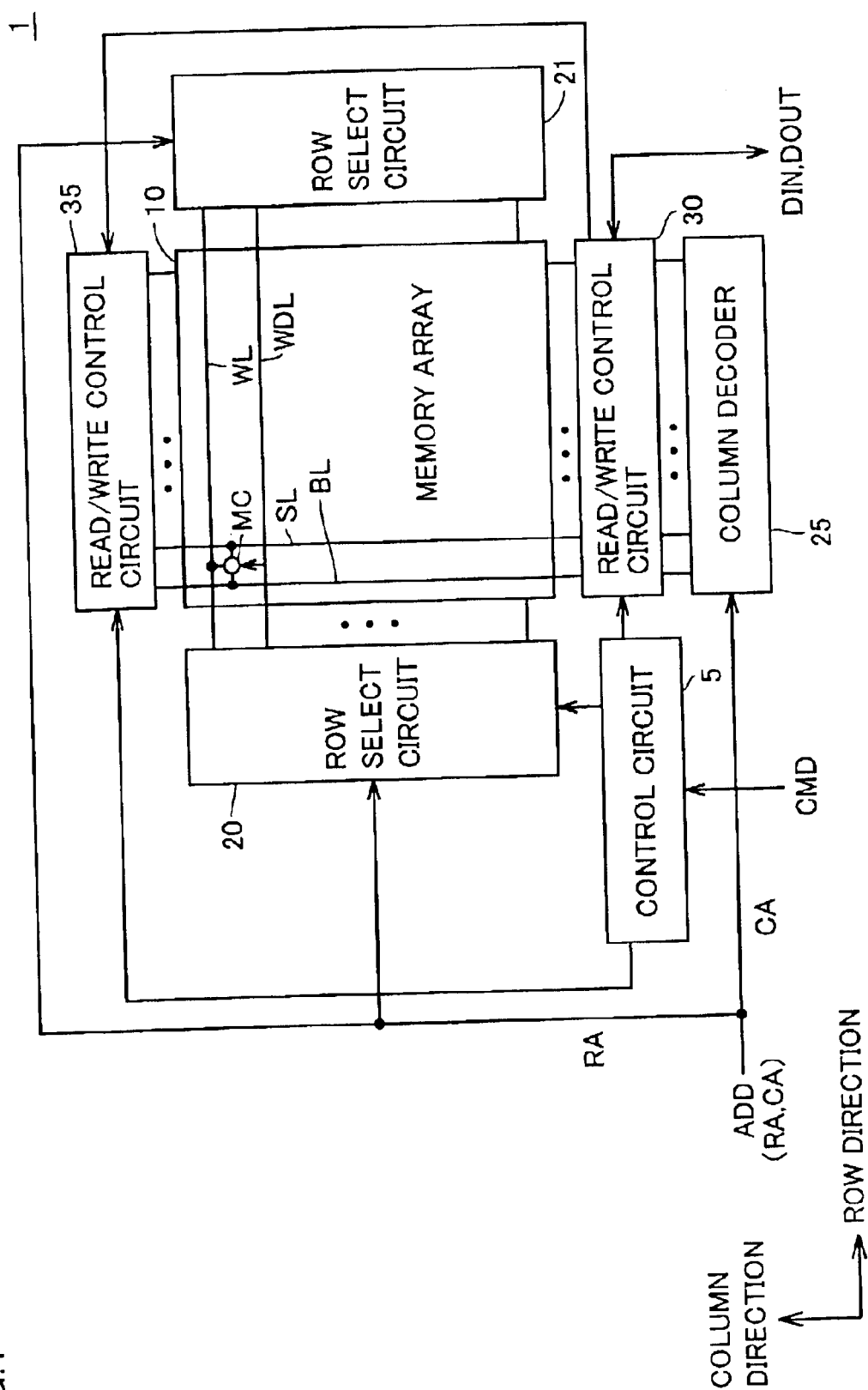
FIG. 1 is a schematic block diagram showing the overall configuration of an MRAM device according to the first embodiment of the present invention.

The embodiments of the present invention will be described hereinafter in detail with reference to the drawings. It is noted that same or corresponding constituent elements are denoted by the same reference symbols, respectively in the drawings and will not be repeatedly described herein.

First Embodiment

Referring to FIG. 1, an MRAM device 1 according to the first embodiment of the present invention randomly accesses a memory cell in response to an external control signal CMD and an external address signal ADD, and executes writing input data DIN and reading read data DOUT.

MRAM device 1 includes a control circuit 5 which controls the overall operation of MRAM device 1 in response to control signal CMD, and a memory array 10 which includes a plurality of MTJ memory cells MC arranged in a matrix.

The row and column of a plurality of tunnel magneto-resistance elements TMR arranged in memory array 10 in a matrix will be also referred to as "memory cell row" and "memory cell column" hereinafter, respectively.

Since the configuration of tunnel magneto-resistance element TMR and the principle of data storage are the same as those already described with reference to FIGS. 21 to 25, they will not be repeatedly described herein in detail. Each tunnel magneto-resistance element TMR stores one of "H" level ("1") and "L" level ("0") as stored data, and the electric resistance of tunnel magneto-resistance element TMR changes according to the level of the stored data.

FIG. 1 typically shows the arrangement of one MTJ memory cell MC, as well as word line WL, write digit line WDL, bit line BL and source line SL corresponding to MTJ memory cell MC. Word line WL and write digit line WDL are arranged in a row direction. Bit line BL and source line SL are arranged in a column direction.

During data write, data write currents in the row direction and the column direction are supplied to write digit line WDL in a memory cell row corresponding to a selected memory cell (to be also referred to as "selected row" hereinafter) and to bit line BL in a memory cell column corresponding to the selected memory cell (to be also referred to as "selected column" hereinafter), respectively. During data read, word line WL corresponding to a selected memory cell is activated, and a data read current passes through the selected memory cell and bit line BL.

The arrangement of MTJ memory cells MC and signal line groups described above in memory array 10 will be described later in detail. The binary high voltage state (at power supply voltage Vcc) and low voltage state (at fixed voltage Vss/ground voltage GND) of each of signals, signal lines, data and the like will be also referred to as "H" level and "L" level hereinafter, respectively.

MRAM device 1 also includes row select circuits 20 and 21 each of which decodes a row address RA indicated by an address signal ADD and which executes row selection in memory array 10, a column decoder 25 which decodes a column address CA indicated by address signal ADD and which executes column selection in memory array 10, and read/write control circuits 30 and 35.

Read/write control circuits 30 and 35 generically represent a circuit which supplies a data write current to bit line BL during data read, a circuit which supplies a data read current to bit line BL during data read, a circuit which generates read data DOUT during data read, and the like. In addition, each write digit line WDL is coupled to fixed voltage Vss in row select circuit regions opposite each other across memory array 10.

Figure 2:
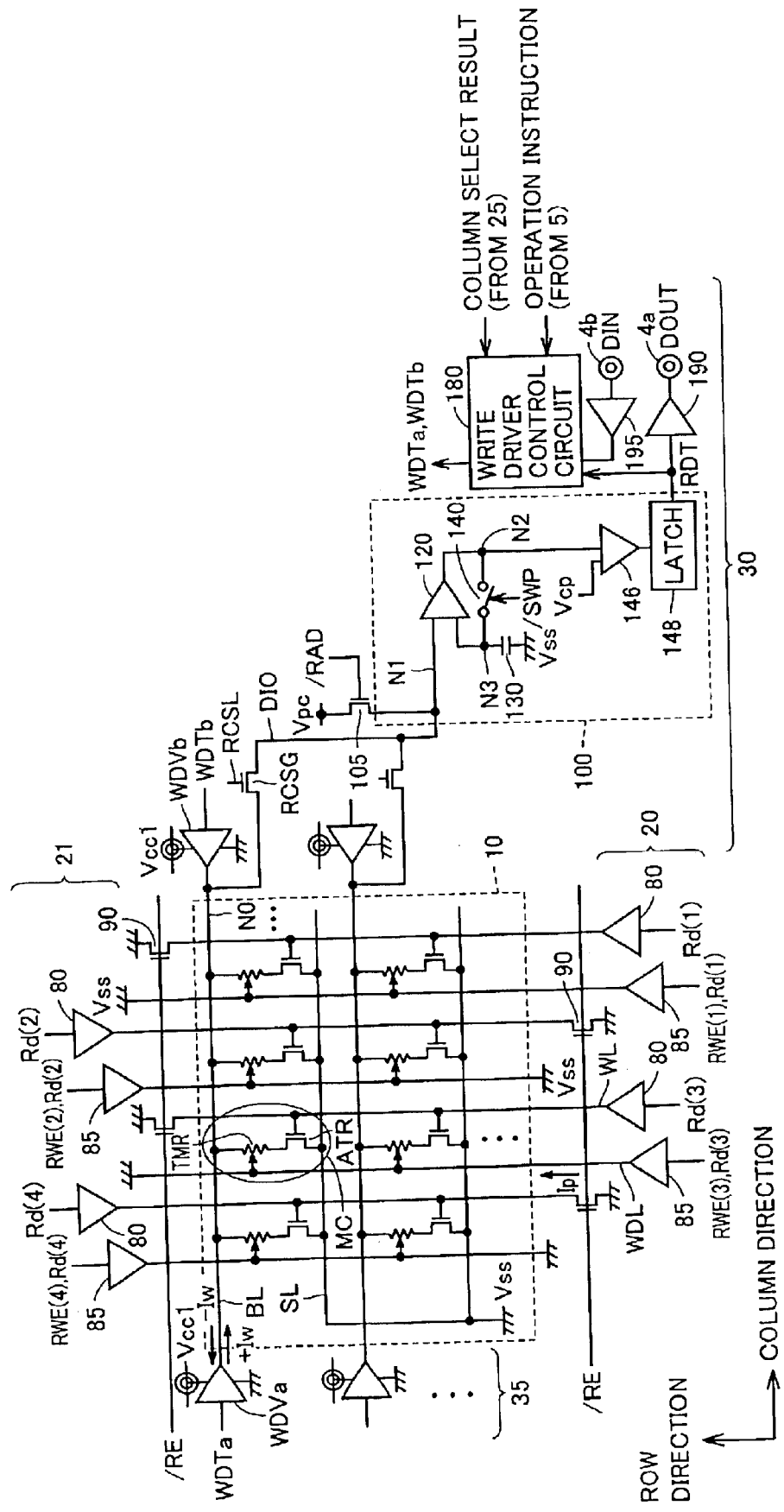
FIG. 2 is a circuit diagram showing the configuration of a circuit group for executing a data read operation and a data write operation to a memory array according to the first embodiment.

Referring to FIG. 2, MTJ memory cells MC are arranged in a matrix in memory array 10. By way of example, memory cells MC arranged in a 4×2 matrix in memory array 10 are shown. As already described, word lines WL and write digit lines WDL are arranged to correspond to the respective memory cell rows, and bit lines BL and source lines SL are arranged to correspond to the respective memory cell columns. Each MTJ memory cell MC has the same configuration as that described with reference to FIG. 21, and includes tunnel magneto-resistance element TMR and access transistor ATR which are coupled in series between corresponding bit line BL and source line SL.

As already described above, tunnel magneto-resistance element TMR has electric resistance according to a magnetic direction. That is, before data is read, tunnel magneto-resistance element TMR is magnetized in a predetermined direction and the electric resistance of tunnel magneto-resistance element TMR is set at either Rmax or Rmin so as to store data at "H" level ("1") or "L" level ("0") in each MTJ memory cell MC.

Each source line SL is coupled to fixed voltage Vss (which is typically ground voltage GND). The source voltage of each access transistor ATR is thereby fixed to fixed voltage Vss. As a result, in a selected row for which corresponding word line WL is activated to "H" level, tunnel magneto-resistance element TMR is coupled to bit line BL while the voltage thereof is being pulled down to fixed voltage Vss (ground voltage GND).

The circuit configuration of row select circuits 20 and 21 which execute row selection in memory array 10 will next be described.

Each of row select circuits 20 and 21 includes word line drivers 80 and write digit line drivers 85 arranged to correspond to the respective memory cell rows. Each word line driver 80 is supplied with a power supply voltage Vcc2 and fixed voltage Vss and each write digit line driver 85 is supplied with a power supply voltage Vcc1 and fixed voltage Vss, though not shown in FIG. 2. It is noted that power supply voltage Vcc1 is higher than power supply voltage Vcc2, i.e., |(Vcc1−Vss)|>|Vcc2−Vss|.

Each word line driver 80 is provided on one end side of word line WL, and controls the activation of corresponding word line WL on the basis of corresponding one of row decode signals Rd(1) to Rd(4), . . . which show decoding results of the respective memory cell rows. Specifically, word line WL is coupled to power supply voltage Vcc2 ("H" level) by word line driver 80 when being activated, and coupled to fixed voltage Vss by word line driver 80 when being deactivated.

Each write digit line driver 85 is provided on one end side of write digit line WDL, and controls the activation of corresponding write digit line WDL on the basis of corresponding one of control signals RWE (1) to (4), . . . generated by control circuit 5 during a data read operation to be described later. Specifically, write digit line WDL is coupled to power supply voltage Vcc1 ("H" level) by write digit driver 85 when being activated, and coupled to fixed voltage Vss by write digit line driver 85 when being deactivated. Row decode signals Rd(1) to Rd(4), . . . will be also generically, simply referred to as "row decode signals Rd" and control signals RWE(1) to (4), . . . will be also generically, simply referred to as "control signals RWE" hereinafter.

Row decode signal Rd is obtained by a decoding circuit, which is not shown, set at "H" level (power supply voltage Vcc2) if a corresponding memory cell row is selected, and otherwise set at "L" level (fixed voltage Vss). Row decode signal Rd in each memory cell row is held by a latch circuit, not shown, at least in one data write operation.

Further, a transistor switch 90 for coupling the other end of word line WL to fixed voltage Vss is arranged to correspond to each memory cell row except during data read. Transistor switch 90 receives an inverted signal /RE of control signal RE which is activated ("H" level) during data read at a gate, and is electrically coupled between word line WL and fixed voltage Vss. In the configuration example of FIG. 2, transistor switch 90 consists of an N-channel MOS (Metal Oxide Semiconductor) transistor. It is assumed in the present specification that a MOS transistor represents a field effect transistor. In the specification, symbol "/" denotes inversion, negation, complement or the like. This applies hereafter.

The other end of write digit line WDL is connected to fixed voltage Vss. Accordingly, during data write, data write currents Ip are supplied to activated write digit line WDL in a direction from write digit line driver 85 toward fixed voltage Vss.

During data read, each word line WL is disconnected from fixed voltage Vss by transistor switch 90. Word line driver 80 activates corresponding word line WL in accordance with row decode signal Rd in the corresponding memory cell row. In response to the activation of word line WL, access transistor ATR corresponding to a selected row is turned on, thereby electrically coupling a magnetic tunnel junction MTJ between bit line BL and source line SL. Thus, a row select operation is executed in memory array 10.

The above-described configuration is provided similarly to correspond to word line WL and write digit line WDL in each memory cell row. As shown in FIG. 2, word line driver 80 and write digit line driver 85 are arranged in a staggered fashion in each memory cell row. Namely, word line drivers 80 or write digit line drivers 85 are arranged alternately on one end side of word line WL or write digit line WDL and on the other end side of word line WL or write digit line WDL per row. By arranging so, it is possible to arrange row select circuits 20 and 21 efficiently with small area.

Read/write control circuit 30 also includes a write driver control circuit 180. Write driver control circuit 180 operates in response to an operation instruction from control circuit 5. In an operative state, write driver control circuit 180 sets write control signals WDTa and WDTb for each memory cell column in accordance with input data DIN transmitted through a data input terminal 4b and an input buffer 195 and a column select result from column decoder 25. Further, write driver control circuit 180 sets write control signals WDTa and WDTb in response to read data RDT from a data read circuit to be described later within one data read operation period.

Read/write control circuit 30 further includes a write driver WDVb arranged to correspond to each memory cell column. Likewise, read/write control circuit 35 includes a write driver WDVa arranged to correspond to each memory cell column. In each memory cell column, write driver WDVa drives one end side of corresponding bit line BL at either power supply voltage Vcc1 or fixed voltage Vss in accordance with corresponding write control signal WDTa. Likewise, write driver WDVb drives the other end side of corresponding bit line BL at either power supply voltage Vcc1 or fixed voltage Vss in accordance with corresponding write control signal WDTb.

During data write, write control signals WDTa and WDTb corresponding to a selected column are set at "H" level and "L" level or vice versa according to the level of written data. For example, if "H" level ("1") data is to be written, write control signal WDTa is set at "H" level and write control signal WDTb is set at "L" level in order to supply data write current +Iw in a direction from write driver WDVa to write driver WDVb. Conversely, if "L" level ("0") data is to be written, write control signal WDTb is set at "H" level and write control signal WDTa is set at "L" level in order to supply data write current −Iw in a direction from write driver WDVb to write driver WDVa. Data write currents +Iw and −Iw different in direction will be also generically referred to as "data write current ±Iw" hereinafter.

In an unselected column, write control signals WDTa and WDTb are both set at "L" level.

Therefore, write data according to the direction of data write currents ±Iw is magnetically written to tunnel magneto-resistance element TMR in which data write currents Ip and ±Iw are supplied to both corresponding write digit line WDL and bit line BL. The same configuration is similarly provided to correspond to bit line BL in each memory cell column.

Next, a circuit group which execute a data read operation for reading data from memory array 10 will be described.

Read/write control circuit 30 also includes a data line DIO which transmits a voltage according to the electric resistance of a selected memory cell, and a read select gate RCSG which is provided between data line DIO and each bit line BL. A read column select line RCSL which indicates the selected state of a corresponding memory cell column is coupled to the gate of read select gate RCSG. Each read column select line RCSL is activated to "H" level if a corresponding memory cell column is selected. The same configuration is provided to correspond to each memory cell column. Namely, data line DIO is shared by bit lines BL on memory cell array 10.

By adopting such a configuration, a selected memory cell is electrically coupled to data line DIO through bit line BL in a selected column and corresponding read select gate RCSG when reading data.

Read/write control circuit 30 further includes a data read circuit 100 and a transistor 105.

Data read circuit 100 includes a sense amplifier (voltage amplifier) 120, a voltage holding capacitor 130, a feedback switch 140, a sense amplifier (voltage amplifier) 146, and a latch circuit 148.

Voltage holding capacitor 130 is coupled between a node N3 (corresponding to the other input node of sense amplifier 120) and fixed voltage Vss so as to hold the voltage level of node N3. Sense amplifier 120 amplifies the voltage difference between nodes N1 and N3 and outputs the amplified voltage signal to a node N2 (corresponding to the output node of sense amplifier 120). Feedback switch 140 is provided between nodes N2 and N3. Feedback switch 140 is turned on in response to a control signal /SWP which is an inverted signal of a control signal SWP.

Sense amplifier 146 amplifies the voltage difference between a preset reference voltage Vcp and the voltage of node N2 and outputs the amplified voltage signal. Latch circuit 148 latches the output of sense amplifier 146 and outputs the latched output as read data RDT during a data read operation. Read data RDT read from latch circuit 148 is outputted as read data DOUT from a data output terminal 4a through an output buffer 190. In this way, a plurality of stages of sense amplifiers 120 and 146 amplify the voltage differences between the voltage of nodes N1 and N3, making it possible to secure a sufficient operation margin. In addition, since sensitivity can be changed by adjusting the level of reference voltage Vcp inputted into second-stage sense amplifier 146, it is possible to correct the change of sensitivity resulting from irregularities in element characteristics during manufacturing process.

Transistor 105 consists of an N-channel MOS transistor, and the gate thereof receives a control signal /RAD which is an inverted signal of a control signal RAD which is activated (to "H" level) during data read. Namely, transistor 105 is turned on unless data read is executed.

Accordingly, before data is read, transistor 105 is turned on to thereby connect data line DIO to precharge voltage Vpc. In this stage, data line DIO is charged with precharge voltage Vpc since read select gate RCSG in each memory cell column is turned off to disconnect bit line BL from memory cell MC.

If data read starts, word line WL in a selected row and read column select line RCSL in a selected column are activated to "H" level, and the voltage of data line DIO is pulled down to fixed voltage Vss (ground voltage GND) through a selected memory cell. Following this, data read current Is which passes through the selected memory cell, is supplied by precharge voltage Vpc and a voltage according to the electric resistance of the selected memory cell is generated on data line DIO.

The operation of data read circuit 100 will next be described in detail with reference to FIG. 3.

Figure 3:
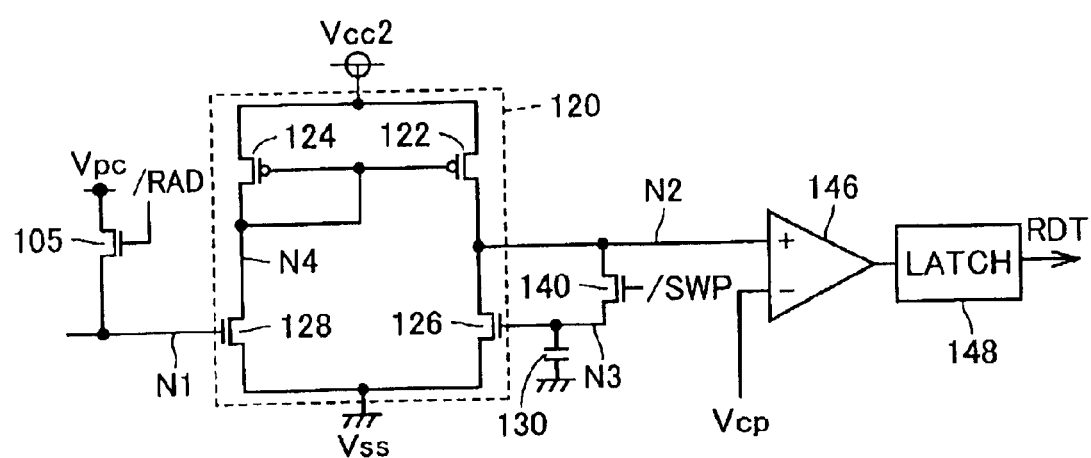
FIG. 3 is a circuit diagram showing the configuration of the important parts of a data read circuit.

Referring to FIG. 3, in the data read circuit shown in FIG. 2, sense amplifier 120 includes P-channel MOS transistors 122 and 124 which are connected between power supply voltage Vcc2 and nodes N2 and N4, respectively, and N-channel MOS transistors 126 and 128 which are connected between nodes N2 and N4 and fixed voltage Vss, respectively. The gate of each of transistors 122 and 124 is connected to node N4, that of transistor 126 is connected to node N3, and that of transistor 128 is connected to node N1. Namely, transistors 122 to 128 operate as a "differential amplifier" which has nodes N1 and N3 used as input nodes and node N2 as an output node.

Since the arrangement of voltage holding capacitor 130, feedback switch 140, sense amplifier 146 and latch circuit 148 is already described with reference to FIG. 2, it will not be repeatedly described herein.

Before a data read operation, a precharge voltage is supplied to node N1. In addition, feedback switch 140 is turned on, and nodes N2 and N3 are short-circuited.

In this state, the data read operation starts, and the voltage of data line DIO is pulled down to fixed voltage Vss (ground voltage GND) through a selected memory cell. The voltage of data line DIO thereby becomes lower than precharge voltage Vpc according to the current which passes through the selected memory cell, i.e., the electric resistance of the selected memory cell. The voltage of data line DIO during the data read operation is determined according to the relationship with the impedance (electric resistance) of the selected memory cell.

In a first half period since one data read operation starts, i.e., in an initial data read operation to be described later, control signal /SWP is activated to "H" level. Therefore, feedback switch 140 is turned on, so that nodes N2 and N3 are kept short-circuited. As a result, nodes N1, N2 and N3 are virtually short-circuited by the negative feedback operation of sense amplifier 120 due to a virtual short-circuit effect, and nodes N1, N2 and N3 are set at same voltage level. The voltage of node N3 in this state is held by voltage holding capacitor 130.

To be strict, nodes N1 and N3 are not set at the same voltage level, depending on irregularities in the element characteristics of circuit elements which constitute sense amplifier 120. However, the voltage of node N3 is set in equilibrium with that of node N1 according to the voltage of node N1, while taking account of such irregularities. Thus, in this period, the offset adjustment of the sense amplifier is also carried out.

Thereafter, in a second half period since one data read operation starts, i.e., in a predetermined data read operation to be described later, nodes N2 and N3 are electrically disconnected from each other. In this state, node N3 is opened and the present voltage state of node N3 is held by voltage holding capacitor 130. If the resistance value of the memory cell changes when data is re-read next, the voltage of a node N0 changes and so does the voltage of node N1. In response to this change, the voltage of node N2 changes. Since the voltage of node N3 is held in a predetermined voltage state by voltage holding capacitor 130, voltage difference is generated between nodes N1 and N3. Accordingly, sense amplifier 120 amplifies this voltage difference and outputs the amplified voltage signal to node N2.

The one data read operation for reading data to memory array according to the first embodiment will be described with reference to the flow chart of FIG. 4.

Figure 4:
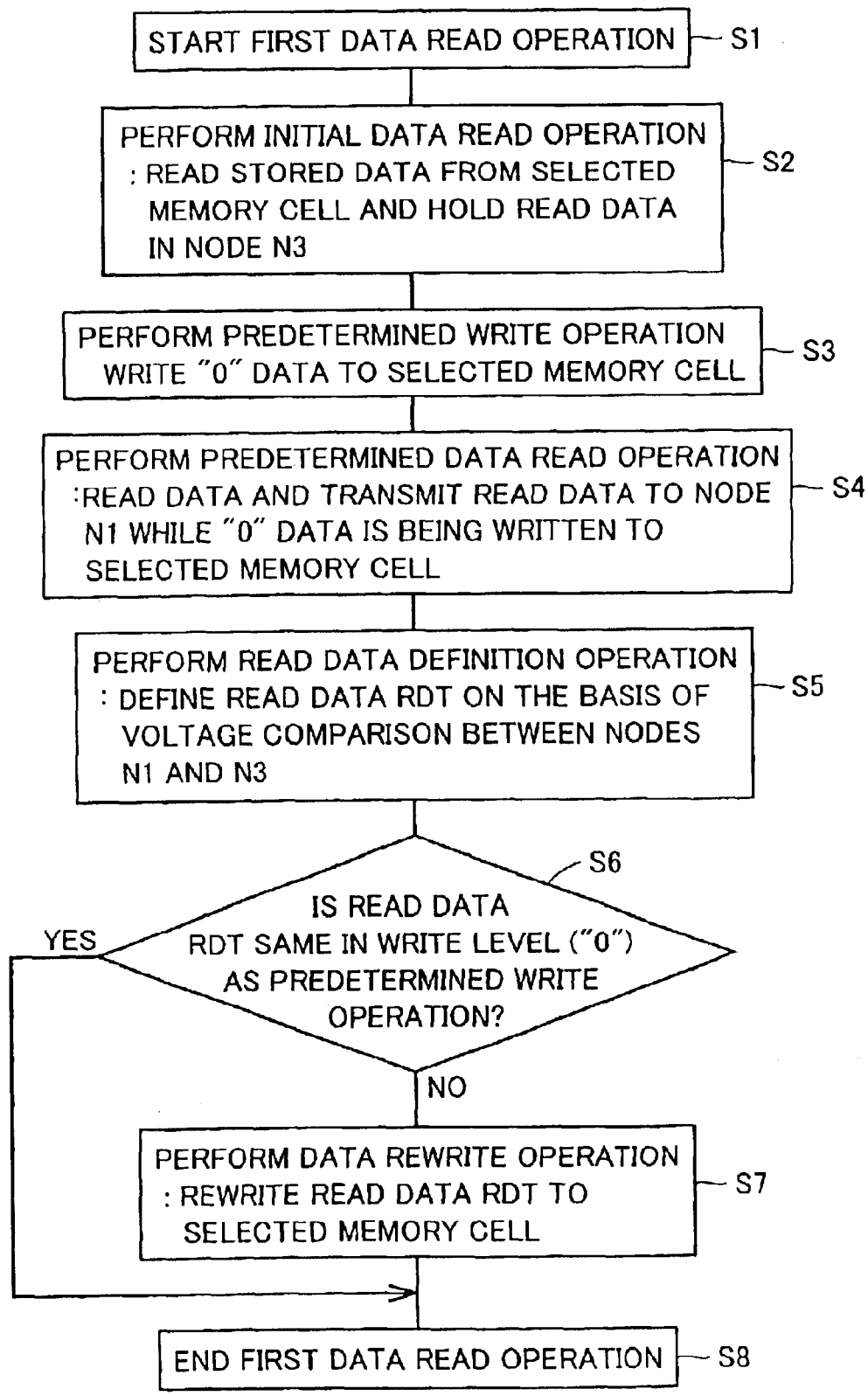
FIG. 4 is a flow chart for describing one data read operation executed to the memory array according to the first embodiment.

Referring to FIG. 4, in the configuration according to the first embodiment, when one data read operation starts (in step S1), data read is executed, as an initial data read operation, while the magnetic direction of a selected memory cell is the same as that before the data read operation, i.e., the selected memory cell is holding stored data to be read. In the initial data read operation, the voltage of data line DIO (also simply referred to as "data line voltage" hereinafter) is transmitted to node N3 and held (in step S2).

Next, as a predetermined write operation, data at predetermined level (e.g., "0") is written to the selected memory cell. Namely, the selected memory cell is applied with a data write magnetic field to write the data at predetermined level (in step S3). Further, while the data with the predetermined level ("0") is being written to the selected memory cell, data read intended at a selected memory cell group is executed as a predetermined data read operation. The data line voltage at this time is transmitted to node N1 (in step S4).

In the predetermined data read operation, if the forced written data level in the preceding predetermined write operation is equal to that of the stored data of the selected memory cell, the data line voltage is equal to that in the initial data read operation. If the data different in level from the stored data of the selected memory cell is forcedly written in the preceding predetermined write operation, the data line voltage in the predetermined data read operation rises or falls from that in the initial data read operation.

When a series of operations from the initial data read operation to the predetermined data read operation are finished, the data line voltages of the predetermined data read operation and the initial data read operation are held at nodes N1 and N3, respectively. In this state, read data RDT which indicates the stored data read from the selected memory cell is defined on the basis of the voltage comparison between nodes N1 and N3 (in step S5). If comparing the data line voltages between the two read operations, the data line voltage can be detected by extracting the stored data of the selected memory cell.

Next, it is determined whether read data RDT defined in step S5 is equal to the data ("0") written in the predetermined write operation (in step S6). If it is determined that defined read data RDT is not equal to the stored data of the selected memory cell, read data RDT is rewritten to the selected memory cell after defining read data RDT (in step S7). By doing so, the stored data of the selected memory cell which has been subjected to the predetermined data write in a read operation sequence can be reproduced and a state before the data read can be reproduced. On the other hand, if it is determined that the stored data of the selected memory cell is equal to read data RDT, the next rewrite operation (step S7) is skipped, thus finishing the one data read operation (in step S8). If the both data are equal in level, the stored data of the selected memory cell is already equal in level to the data (read data RDT) to be rewritten in following step S6. Due to this, there is no need to execute the data rewrite operation. As a result, the unnecessary data rewrite operation is omitted, making it possible to decrease current consumption in the data read operation. It is noted that the above-described determination operation can be executed by write driver control circuit 180.

Figure 5:
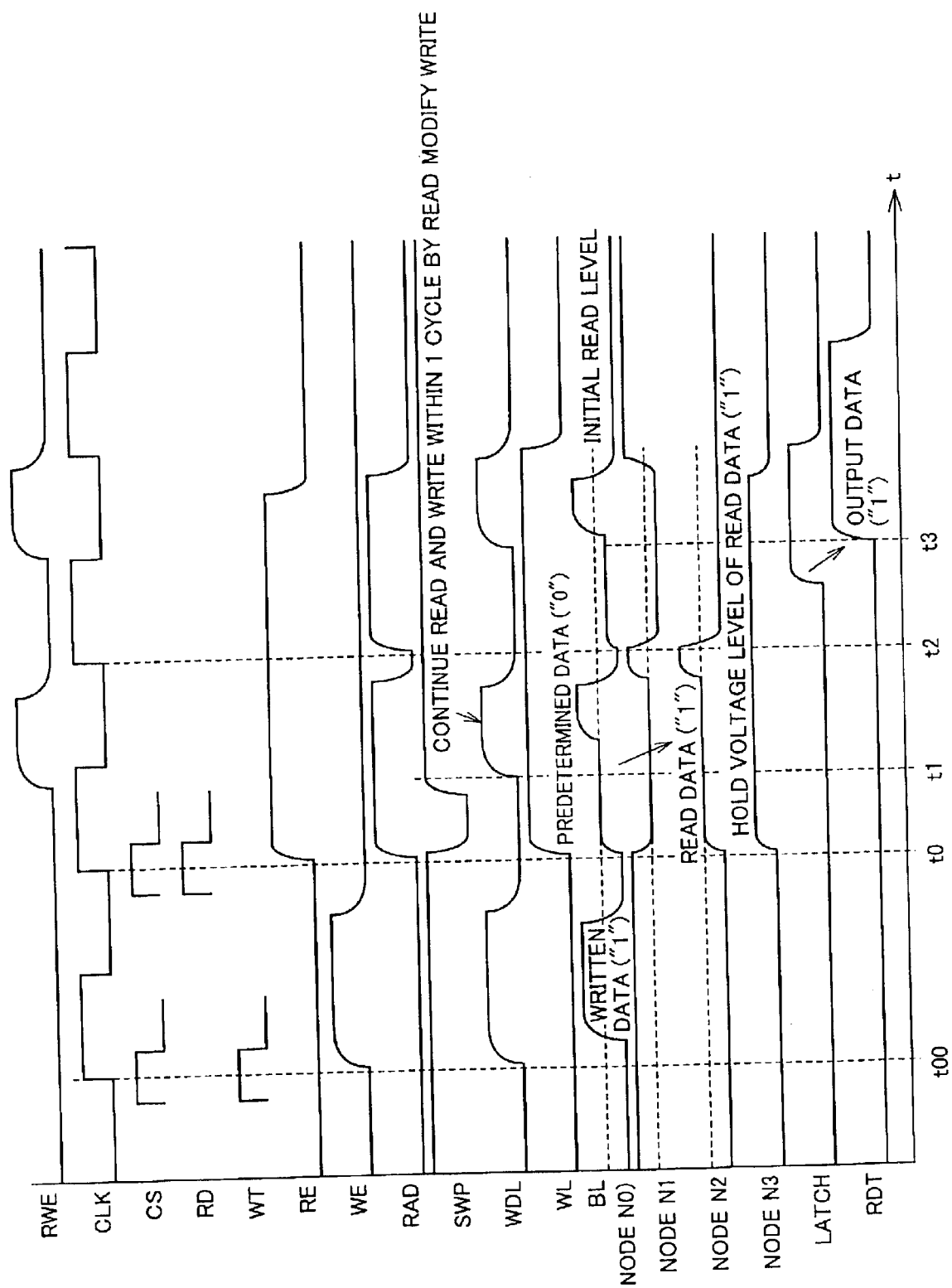
FIG. 5 is an operation waveform view for describing the data read operation according to the first embodiment.

Referring to FIG. 5, one data read operation in the first embodiment can be executed synchronously with, for example, a clock signal CLK.

Now, before describing the data read operation, a data write operation will be described.

At time t00 which is the activation edge of clock signal CLK, a chip select signal CS and a write command WT are incorporated, and a data write operation is then executed. In the data write operation, write digit line WDL in a selected row is activated and a data write current corresponding to written data is supplied to bit line BL in a selected column. If data write current −Iw corresponding to data ("1") is supplied to bit line BL in the selected row, for example, data ("1") is written to a selected memory cell.

Next, a data read operation for reading data from the selected memory cell to which the data ("1") has been written will be described.

Namely, at time t0 which is the activation edge of clock signal CLK, chip select signal CS and write command RD are incorporated and an initial data read operation is then executed. In the initial data read operation, word line WL in the selected row is activated and data read current Is is supplied to bit line BL in the selected column. The voltage which is generated on data line DIO by data read current Is, i.e., the data line voltage in a state in which the selected memory cell holds inherent stored data, is transmitted to node N1. In this state, control signal SWP is at "L" level and control signal /SWP which is the inverted signal of control signal SWP is at "H" level, so that feedback switch 140 is turned on. Accordingly, the data line voltage corresponding to the stored data ("1") is transmitted to node N3 and held therein by the virtual short-circuit effect.

Next, from time t1 within one cycle of clock signal CLK, a predetermined write operation is executed. Here, so-called read modify write for continuously writing data within one cycle of clock signal CLK, i.e., within the same cycle as that for data read, is executed. Specifically, in response to control signal RWE, write digit line driver 85 is activated to carry data write current Ip to write digit line WDL in the selected row, data write current +Iw is carried to bit line BL in the selected column, and data at predetermined level ("0") is forcedly written to the selected memory cell.

From time t2 which is the next activation edge of clock signal CLK, a predetermined data write operation is executed. Specifically, while word line WL in the selected row is activated, data read current Is is supplied to bit line BL in the selected column. The voltage which is generated on data line DIO by data read current Is, i.e., the data line voltage while the selected memory cell is holding "0" data, is transmitted to node N1.

By executing the predetermined data read operation, the voltages of nodes N1 and N3 become the data line voltages corresponding to states in which the selected memory cell hold stored data "0" and "1", respectively. Accordingly, on the basis of the voltage difference between nodes N1 and N3, read data RDT can be generated at time t3.

Further, after time t3, read data DOUT corresponding to read data RDT is outputted from data output terminal 4a. At the same time, a data rewrite operation is executed to the selected memory cell. Namely, write digit line driver 85 is activated in response to control signal RWE to supply data write current Ip to write digit line WDL in the selected row, and data write current +Iw or −Iw is supplied to bit line BL in the selected column in accordance with the level of read data RDT. In this case, data write current −Iw is supplied to bit line BL in the selected column to correspond to the data ("1"). As a result, the data equal in level to read data RDT is written to the selected memory cell, and the selected memory cell returns to the same state as that prior to the data read operation.

The above example has been described while assuming that the stored data of the selected memory cell is ("1").

However, even if data is ("0"), the same operations can be performed. That is, if stored data equal in level to that in the predetermined write operation is stored in the selected memory cell, no voltage difference is generated and the voltage is outputted as it is. If no voltage difference is generated so as to generate read data RDT according to the comparison with the known data, second-stage sense amplifier 146 outputs data ("0").

The above example has been described while assuming that the level of the data written to the selected memory cell in the predetermined write operation is data ("0"). However, even if data ("1") is written, the predetermined data read operation can be executed.

Further, as described above, if the data equal to the predetermined data is read from the selected memory cell when data is to be rewritten, it is possible not to execute the data rewrite operation. As a result, the unnecessary rewrite operation is omitted, making it possible to decrease current consumption in the data read operation.

Furthermore, in one data read operation for reading data from the selected memory cell, the data read operation can be executed only by accessing a selected memory group without using a reference cell. Namely, on the basis of voltage comparison which is executed on the same data read path including the same memory cells, same bit lines, same data lines, same sense amplifiers and the like, data read is executed by a so-called self-reference method.

As a result, it is possible to avoid the influence of offset or the like resulting from manufacturing irregularities in the respective circuits which constitute the data read path, and it is thereby possible to improve the accuracy of the data read operation. In other words, compared with a case of executing a data read operation for reading data from the selected memory cell on the basis of the comparison with the other memory cell such as the reference cell or a data read circuit system accompanied by the other memory cell, it is possible to eliminate influences such as manufacturing irregularities and to execute highly accurate data read. In addition, the reference cell is not necessary, so that each MTJ memory cell can be made execute data storage and all MTJ memory cells can be used as effective bits.

Moreover, by adopting the so-called read modify write method for continuously executing read and write operations within one clock cycle, it is possible to further accelerate one data read operation.

Besides, since word line WL is kept activated (at "H" level) in one data read operation, it is possible to decrease power consumption by as much as power consumption followed by charge and discharge.

Modification of First Embodiment

In a modification of the first embodiment, a data read operation if memory cells MC constituting the memory array are replaced by ITMR type MTJ memory cells MC# from which access transistors ATR are eliminated, respectively, will be described.

Figure 6:
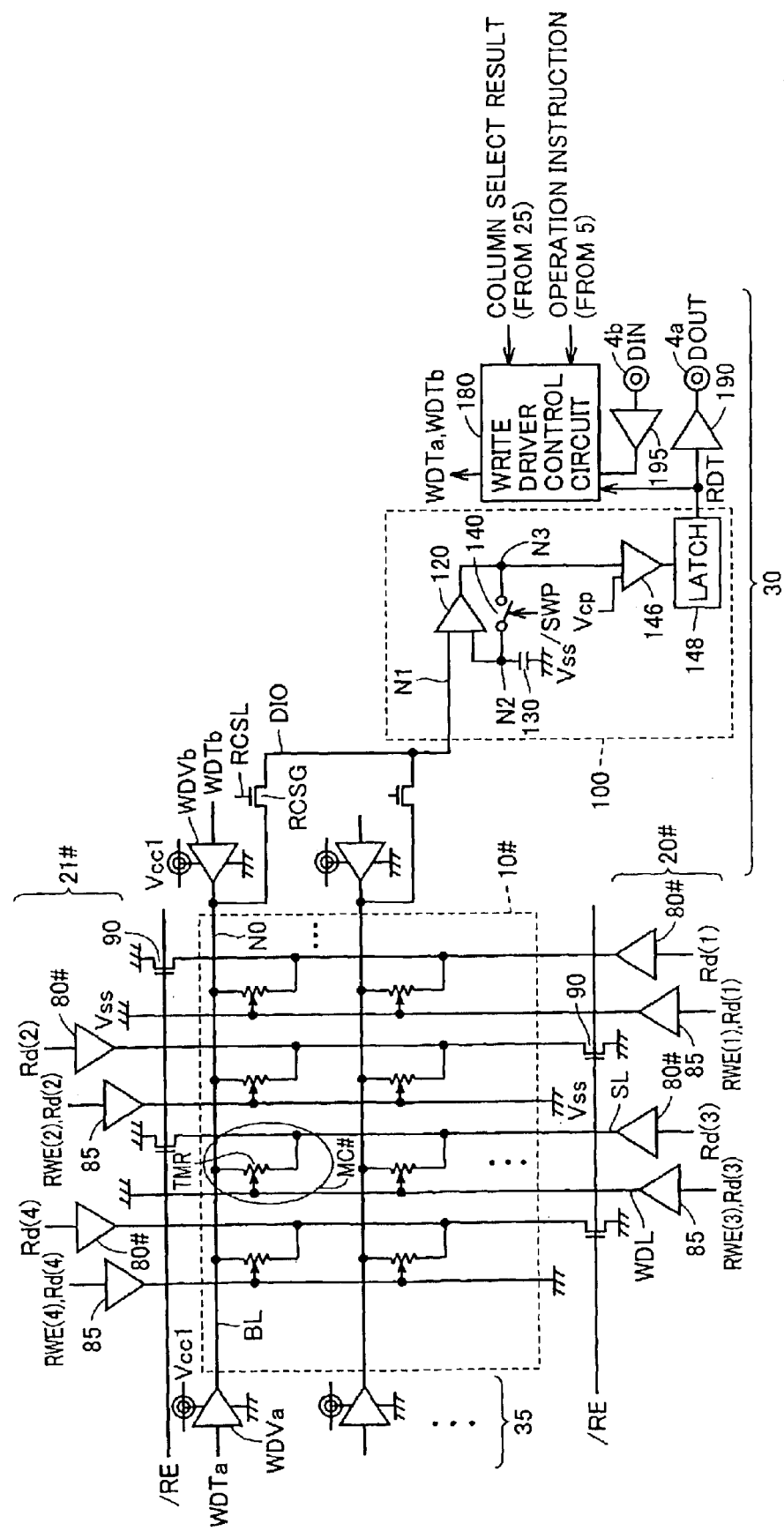
FIG. 6 is a circuit diagram showing the configuration of a circuit group for executing a data read operation and a data write operation to a memory array in a modification according to the first embodiment of the present invention.

Referring to FIG. 6, a circuit group for executing data read operation and data write operation to memory array according to the modification of the first embodiment differs from that in the first embodiment in that memory array 10 is replaced by a memory array 10# and row select circuits 20 and 21 are replaced by row select circuits 20# and 21#, respectively. Since the other constituent elements of the circuit group in this modification are the same as those in the first embodiment shown in FIG. 2, they will not be repeatedly described herein in detail.

Memory array 10# differs from memory array 10 in that memory cells MC arranged in a matrix are replaced by memory cells MC#.

Figure 7:
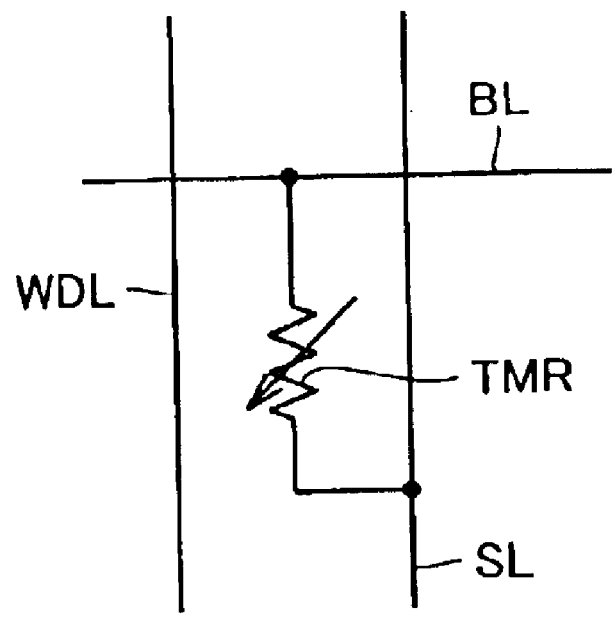
FIG. 7 is a circuit diagram showing an 1 TMR-type MTJ memory cell from which an access transistor is eliminated.

Referring to FIG. 7, in ITMR type MTJ memory cell MC#, tunnel magneto-resistance element TMR is arranged between bit line BL and source line SL. That is, MTJ memory cell MC# shown in FIG. 7 differs from MTJ memory cell MC shown in FIG. 21 in that access transistor ATR and word line WL are eliminated and tunnel magneto-resistance element TRM is directly, electrically coupled to source line SL.

Figure 8:
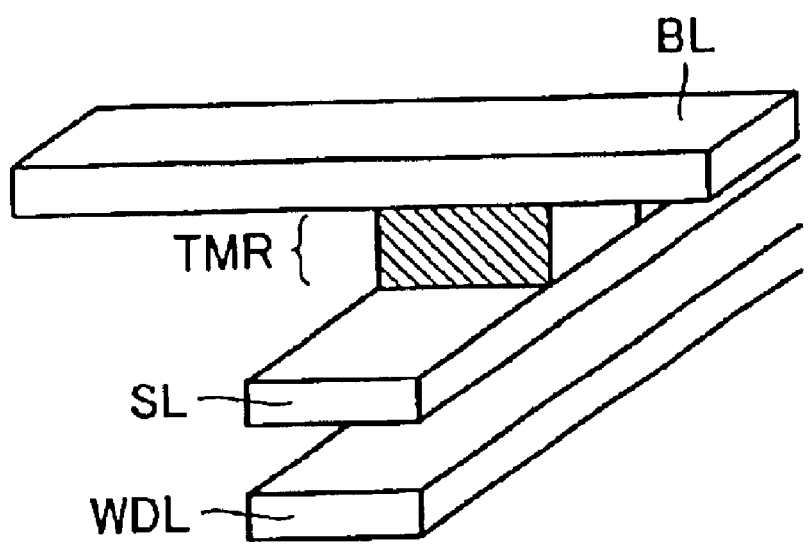
FIG. 8 is a block diagram of an MTJ memory cell.

Referring to FIG. 8, tunnel magneto-resistance element TMR in MTJ memory cell MC# shown in FIG. 7, is formed between source line SL and bit line BL. In addition, write digit line WDL is arranged in parallel to source line SL on a lower layer of source line SL.

Each of row select circuits 20# and 21# differs from each of row select circuits 20 and 21 in that a source line driver 80# is provided in place of word line driver 80 arranged per memory cell row. Although not shown, each source line driver 80# is supplied with power supply voltage Vcc2 and fixed voltage Vss. Each source line driver 80# is provided on one end side of each source line SL, and controls the activation of corresponding source line SL on the basis of corresponding one of row decode signals Rd(1) to Rd(4), . . . which indicate decoding results of the respective memory cell rows. Specifically, source line SL is coupled to power supply voltage Vcc2 ("H" level) by source line driver 80# when being activated, and coupled to fixed voltage Vss by source line driver 80# when being deactivated. Since the other constituent elements of each of row select circuits 20# and 21# are the same as those of each of row select circuit 20 and 21 shown in FIG. 2, they will not be repeatedly described herein in detail.

Figure 9:
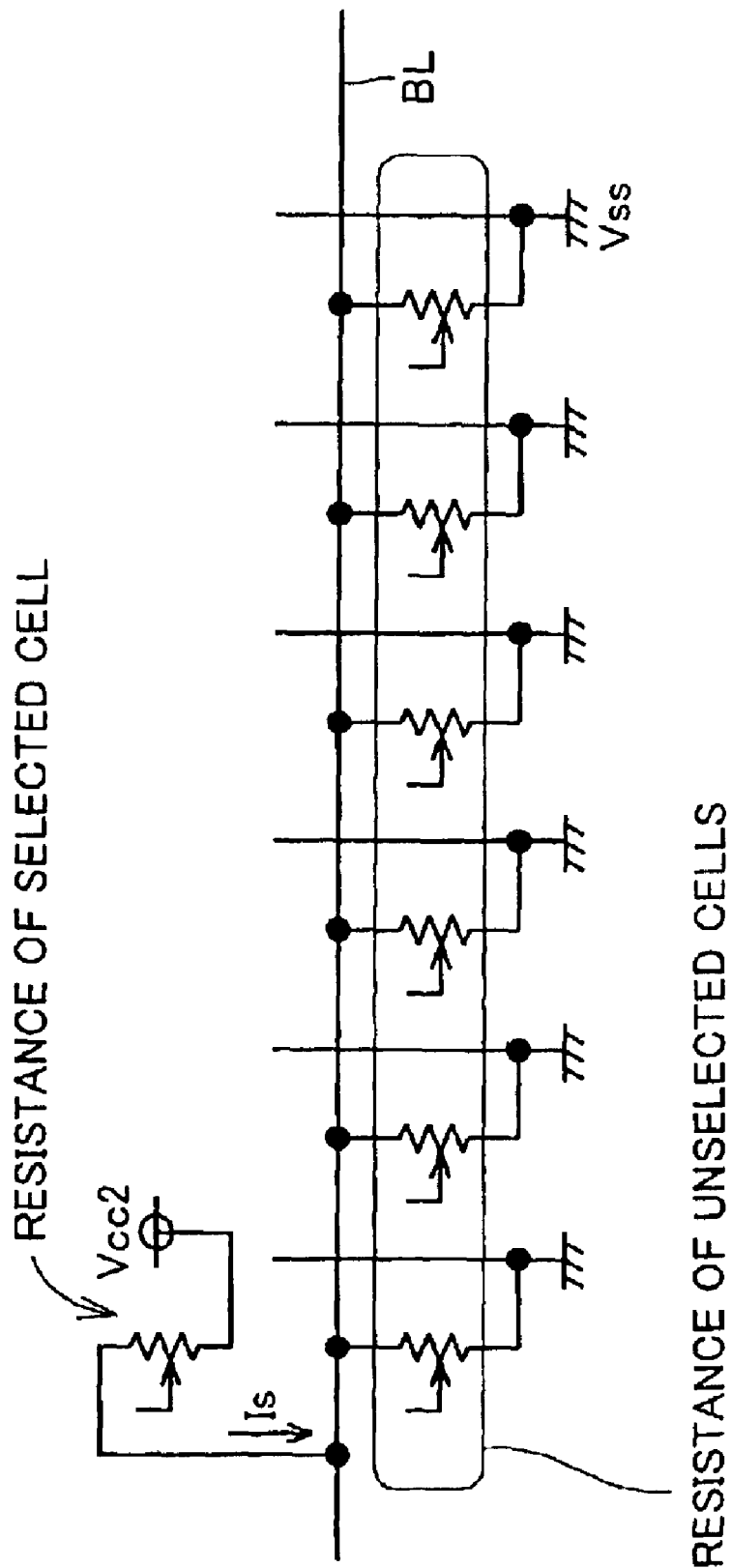
FIG. 9 is a conceptual view of a data read current carried to a selected cell during data read.

Referring to FIG. 9, during data read, if the source line driver corresponding to the selected memory cell is activated, source line drivers corresponding to unselected memory cells are deactivated. Therefore, the selected memory cell is electrically coupled to power supply voltage Vcc2, while the unselected memory cells are electrically coupled to fixed voltage Vss. Accordingly, a current path is formed in the unselected memory cells in the selected column which share bit line BL through the selected memory cell. That is, data read current Is according to the combined resistance of the entire memory cell groups coupled to the bit line in the selected column is supplied. As a result, a voltage according to the combined resistance is generated on data line DIO.

One data read operation according to the modification of the first embodiment of the present invention will be described with reference to FIG. 10.

Figure 10:
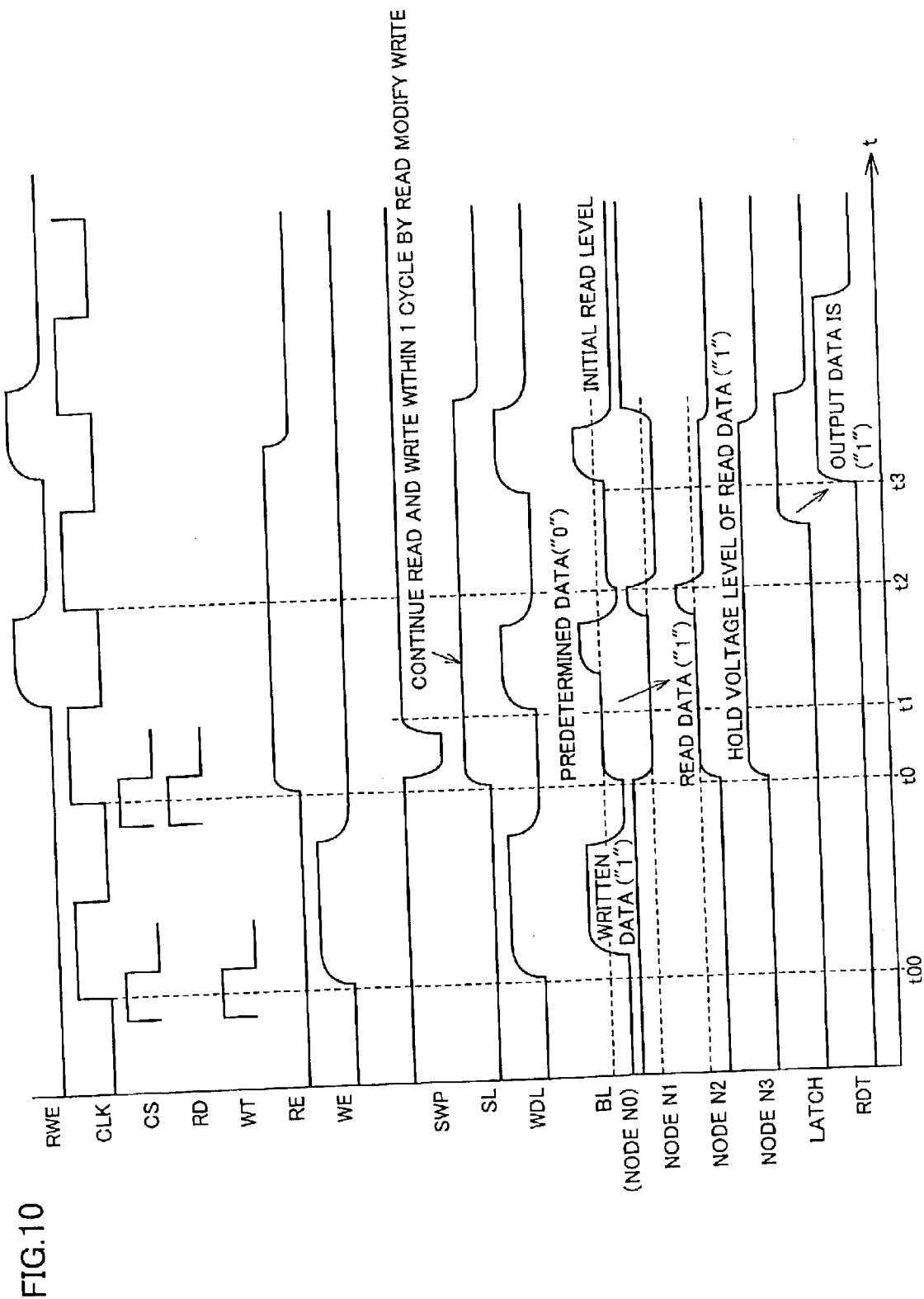
FIG. 10 is an operation waveform view for describing one data read operation according to the modification of the first embodiment of the present invention.

Referring to FIG. 10, one data read operation in the modification of the first embodiment can be executed simultaneously with, for example, clock signal CLK.

Before describing the data read operation, a data write operation will be described.

At time t00 which is the activation edge of clock signal CLK, chip select signal CS and write command WT are incorporated, and a data write operation is then executed. In the data write operation, write digit line WDL in a selected row is activated, and a data write current corresponding to written data is supplied to bit line BL in a selected column. If data write current −Iw corresponding to data ("1") is supplied to bit line BL in the selected column, for example, data ("1") is written to a selected memory cell.

Next, one data read operation for reading data to the selected memory cell to which data ("1") has been written, will be described.

Namely, at time t0 which is the activation edge of clock signal CKL, chip select signal CS and read command RD are incorporated, and an initial data read operation is then executed. In the initial data read operation, source line SL in the selected row is activated, whereby data read current Is is supplied to bit line BL in the selected row through the selected memory cell. The voltage which is generated on data line DIO by data read current Is, i.e., the data line voltage in a state in which the selected memory cell stores inherent stored data, is transmitted to node N1. In this case, if the selected memory cell holds the stored data ("1"), the data line voltage corresponding to the combined resistance of the selected memory cell corresponding to the selected column and the unselected memory cells, is transmitted to node N1. In addition, since control signal /SWP which is the inverted signal of control signal SWP ("L" level) is at "H" level, the voltage level corresponding to the data line voltage is held at node N3 by the virtual short-circuit effect as already described.

Next, from time t1 within one cycle of clock signal CLK, a predetermined write operation is executed. In this case, so-called read modify write for continuously executing data read and data write operations within one cycle of clock signal CLK is executed. Specifically, in response to control signal RWE, write digit line driver 85 is activated, data write current Ip is supplied to write digit line WDL in the selected row, data write current +Iw is supplied to bit line BL in the selected column, and data at predetermined level ("0") is forcedly written to the selected memory cell.

Further, from time t2 which is the next activation edge of clock signal CLK, a predetermined data read operation is executed. Specifically, while source line SL in the selected row is activated, data read current Is is supplied to bit line BL in the selected column through the selected memory cell. The voltage which is generated on data line DIO by data read current Is, i.e., the data line voltage corresponding to the combined resistance of the selected memory cell corresponding to the selected column and unselected memory cells while the selected memory cell holds "0" data, is transmitted to node N1.

By executing the predetermined data read operation, the data line voltages corresponding to states in which the selected memory cell holds stored data "0" and "1" are held at nodes N1 and N3, respectively. Therefore, at time t3, read data RDT can be generated on the basis of the voltage difference between nodes N1 and N3.

Further, after time t3, read data DOUT corresponding to read data RDT is outputted from data output terminal 4a. At the same time, a data rewrite operation is executed to the selected memory cell. Namely, write digit-line driver 85 is activated in response to control signal RWE, data write current Ip is carried to write digit line WDL in the selected row, and data write current +Iw or −Iw is supplied to bit line BL in the selected column in accordance with the level of read data RDT. In this case, data write current −Iw is supplied to bit line BL in the selected column to correspond to data ("1"). As a result, the data equal in level to read data RDT is written to the selected memory cell and the selected memory cell returns to the same state as that before the data read operation.

Even with the configuration in which memory cell MC# from which the access transistor is eliminated is employed as described in the modification of the first embodiment, it is possible to execute the same self-reference read operation as that in the first embodiment. Accordingly, the layout area of one memory cell can be reduced by as much as an area which has been necessary to provide an access transistor on the semiconductor substrate, making it possible to design a mass-storage memory array with small area.

Furthermore, by executing the so-called read modify write operation for continuously executing read and write operations within one clock cycle, it is possible to execute data read operation by the self-reference method at high rate.

Second Embodiment

In the first embodiment, the self-reference read method for executing a data read operation by repeating forced data write and data read operations has been described. In the second embodiment, a configuration for executing a self-reference read operation without destroying the stored data of a selected memory cell will be described.

First, the principle of the data read operation in the second embodiment will be described.

Figure 11:
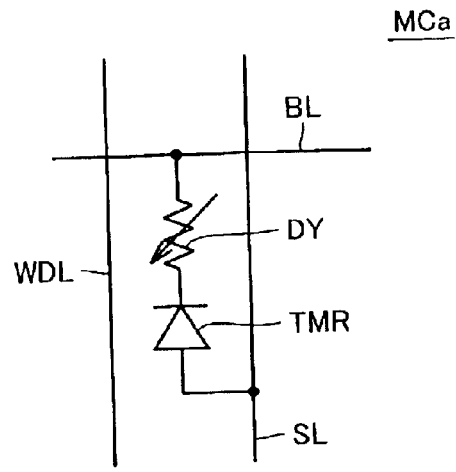
FIG. 11 is a circuit diagram of a memory cell according to the second embodiment of the present invention.
Figure 26:
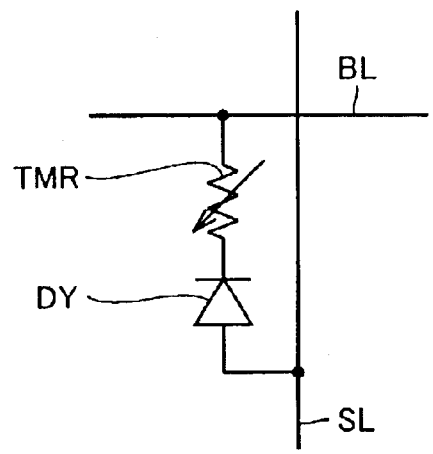
FIG. 26 is a schematic diagram showing the configuration of an MTJ memory cell using a diode element as an access element.

Referring to FIG. 11, an MTJ memory cell MCa which employs a diode in the second embodiment includes tunnel magneto-resistance element TMR and access diode DY. MTJ memory cell MCa differs from MTJ memory cell MC shown in FIG. 26 in that word lines are arranged to be divided into source line SL for read operation and write digit line WDL. Bit line BL is arranged in a direction in which bit line BL intersects with write digit line WDL and source line SL, and electrically coupled to tunnel magneto-resistance element TMR. Access diode DY is coupled between tunnel magneto-resistance element TMR and source line SL in a forward direction from tunnel magneto-resistance element TMR to source line SL. Write digit line WDL is provided to be adjacent tunnel magneto-resistance element TMR without being coupled to the other wirings.

In MTJ memory cell MCa, it is unnecessary to supply a current to source line SL during data write. In MTJ memory cell MC shown in FIG. 26, it is necessary to supply currents to source line SL and bit line BL, respectively, so that a high voltage corresponding to the power supply voltage may possibly be applied to tunnel magneto-resistance element TMR. Due to this, in MTJ memory MC cell shown in FIG. 26, tunnel magneto-resistance element TMR is often destroyed. With the configuration in the second embodiment, since no current is supplied to source line SL, no high voltage is applied to tunnel magneto-resistance element TMR, making it possible to stabilize the data write operation compared with MTJ memory cell MC shown in FIG. 26.

Figure 12:
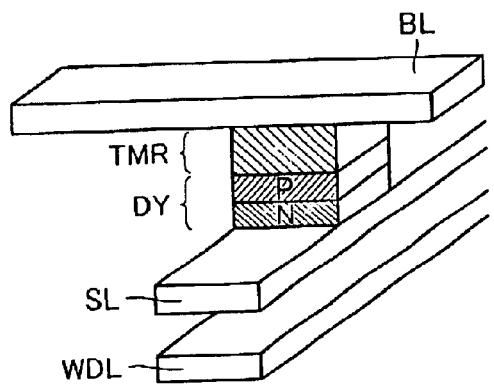
FIG. 12 is a block diagram of the memory cell.
Figure 27:
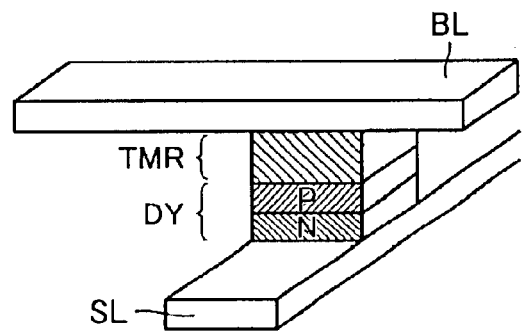
FIG. 27 is a block diagram of an MTJ memory cell using an access diode.

Referring to FIG. 12, MTJ memory cell MCa differs from MTJ memory cell MC shown in FIG. 27 in configuration, i.e., in that write digit line WDL arranged as an independent wiring is additionally provided. Since the other constituent elements are the same as those described in FIG. 27, they will not be repeatedly described herein.

As is obvious from the above, the present invention is intended to accelerate self-reference data read operation by applying a bias magnetic field to a selected memory cell.

The relationship between a current for applying a magnetic field to the MTJ memory cell and the electric resistance of the MTJ memory cell (hysteresis characteristic) will be described with reference to FIG. 13.

Figure 13:
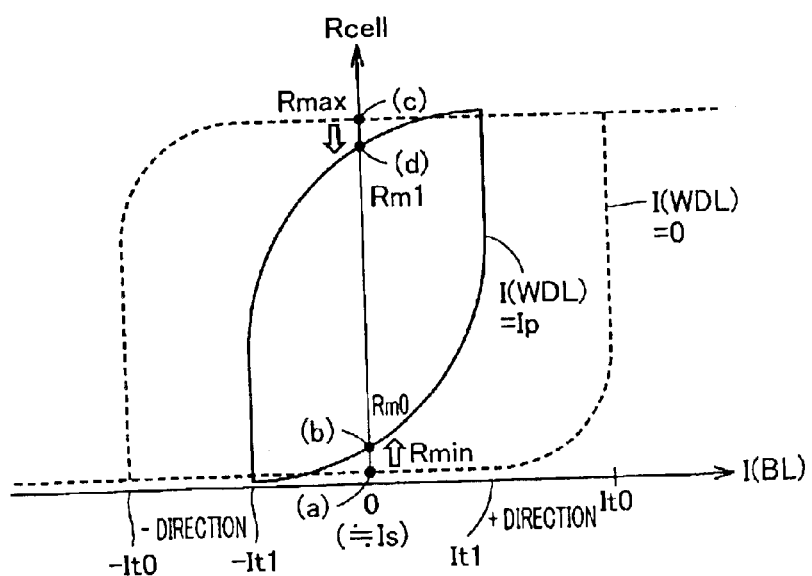
FIG. 13 is a conceptual view for describing the relationship between a current for applying a magnetic field to the MTJ memory cell and the electric resistance of the MTJ memory cell.

Referring to FIG. 13, the horizontal axis indicates bit line current I(BL) carried to bit line BL and the vertical axis indicates the electric resistance Rcell of the MTJ memory cell. The direction of a magnetic field generated by bit line current I(BL) is along the easy axis (EA) direction in free magnetic layer VL shown in FIG. 24. On the other hand, the direction of a magnetic field generated by a digit line current I(WDL) supplied to write digit line WDL is along hard axis (HA) direction in free magnetic layer VL.

Therefore, if bit line current I(BL) exceeds a threshold for inverting the magnetic direction of free magnetic layer VL, the magnetic direction of free magnetic layer VL is inverted and memory cell resistance Rcell changes. In FIG. 13, if bit line current J(BL) in a positive direction which exceeds the threshold is supplied, memory cell resistance Rcell becomes maximum Rmax. If bit line current I(BL) in a negative direction which exceeds the threshold is supplied, memory cell resistance Rcell becomes minimum Rmin. The threshold of bit line current I(BL) changes according to current I(WDL) carried to write digit line WDL.

The hysteresis characteristic of memory cell resistance Rcell if digit line current I(WDL) carried to write digit line WDL is 0 is indicated by a dotted line in FIG. 13. It is assumed herein that the thresholds of bit line current I(BL) in positive and negative directions are It0 and −It0, respectively.

On the other hand, if a current is supplied to write digit line WDL, the threshold of bit line current I(BL) lowers. The hysteresis characteristic of memory cell resistance Rcell if digit line current I(WDL) is Ip is indicated by a solid line in FIG. 13. The thresholds of bit line current I(BL) in the positive and negative directions change to It1 (It1<It0) and −It1 (−It1>−It0), respectively, by the influence of the magnetic field in the hard axis direction generated by digit line current I(WDL). This hysteresis characteristic shows the behavior of memory cell resistance Rcell in a data write operation. Therefore, the ranges of bit line current I(BL) and data write currents +Iw and −Iw in the data write operation are set to satisfy It1<+Iw<It0 and −It0<−Iw<−It1.

Bit line current I(BL) in a data read operation, i.e., data read current Is is supplied as a charge current for data line DIO coupled with a selected memory cell, a parasitic capacitance or the like set as an RC load. Due to this, normally, data read current Is is lower than bit line current I(BL) in the data write operation, i.e., data write current ±Iw by two to three digits. In FIG. 13, therefore, it can be considered that data read current Is≈0.

In a state before data is read, the magnetic direction of the free magnetic layer VL in tunnel magneto-resistance element TMR is set so that memory cell resistance Rcell is in a state (a) or (c) in FIG. 13, i.e., so that the selected memory cell has either electric resistance Rmin or Rmax.

Figure 14A:
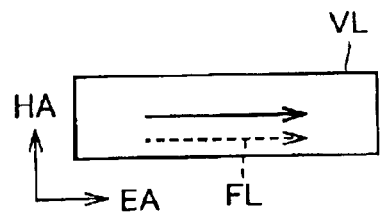
FIGS. 14A to 14D are conceptual views for describing the magnetic direction of a tunnel magneto-resistance element.

FIG. 14A shows the magnetic direction of tunnel magneto-resistance element TMR in the state (a) shown in FIG. 13. In this state, the magnetic direction of free magnetic layer VL is parallel to that of fixed magnetic layer FL, so that memory cell resistance Rcell is set at minimum Rmin.

Figure 14B:
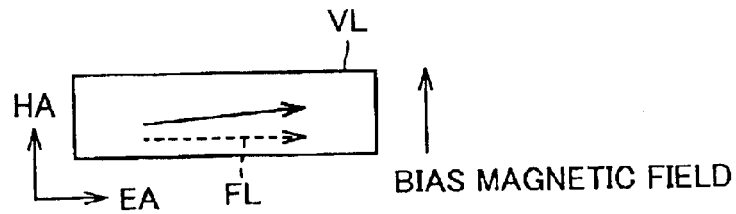
Figure 14C:
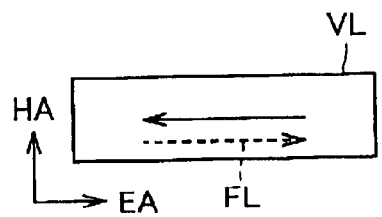

FIG. 14C shows the magnetic direction of tunnel magneto-resistance element TMR in the state (c) shown in FIG. 13. In this state, the magnetic direction of free magnetic layer VL is nonparallel (opposite) to that of fixed magnetic layer FL, so that memory cell resistance Rcell is set at maximum Rmax.

In this state, if a predetermined current (e.g., data write current Ip) is supplied to write digit line WDL, the magnetic direction of free magnetic layer VL is not completely inverted but rotated to some extent, whereby electric resistance Rcell of tunnel magneto-resistance element TMR changes.

For example, as shown in FIG. 14B, if a predetermined bias magnetic field in the hard axis (HA) direction generated by digit line current I(WDL) is further applied to the magnetization state shown in FIG. 14A, the magnetic direction of free magnetic layer VL slightly rotates and forms a predetermined angle with respect to the magnetic direction of fixed magnetic layer FL. As a result, in the magnetization state corresponding to FIG. 14B, memory cell resistance Rcell rises from minimum Rmin to Rm0.

Likewise, if the same predetermined bias magnetic field is further applied to the magnetization state shown in FIG.

Figure 14D:
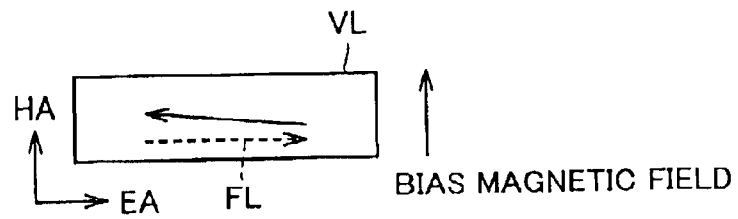

14C, the magnetic direction of free magnetic layer VL slightly rotates and forms a predetermined angle with respect to the magnetic direction of fixed magnetic layer FL. As a result, in the magnetization state corresponding to FIG. 14D, memory cell resistance Rcell lowers from maximum Rmax to Rm1.

As can be seen, by applying the bias magnetic field in the hard axis (HA) direction to the MTJ memory cell, memory cell resistance Rcell of the MTJ memory cell which stores the data corresponding to maximum Rmax, lowers while memory cell resistance Rcell of the MTJ memory cell which stores the data corresponding to minimum Rmin, rises.

Figure 15:
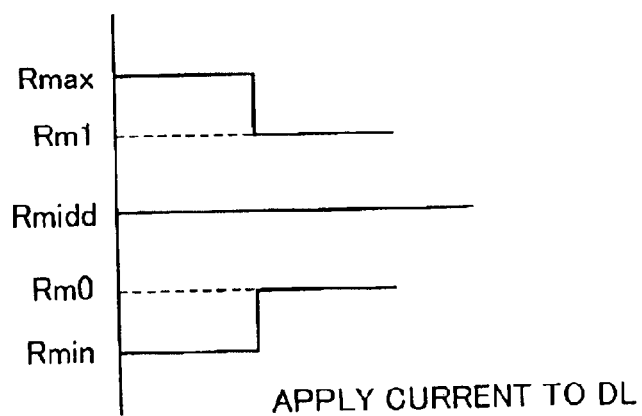
FIG. 15 is a conceptual view showing a state in which the memory cell resistance of the MTJ memory cell changes when a predetermined bias magnetic field is applied to the MTJ memory cell.

Referring to FIG. 15, memory cell resistance Rcell changes from maximum Rmax by applying the predetermined bias magnetic field as described above. Specifically, if the bias magnetic field in the hard axis (HA) direction is applied to the MTJ memory cell, memory cell resistance Rcell of the MTJ memory cell which stores data corresponding to maximum Rmax lowers from maximum Rmax to Rm1. On the other hand, memory cell resistance Rcell of MTJ memory cell which stores data corresponding to minimum Rmin rises from minimum Rmin to Rm0.

In this way, if a bias magnetic field in the hard axis direction is applied to the MTJ memory cell to which certain stored data is written, the change of electric resistance with a polarity according to the stored data can be generated in memory cell resistance Rcell. That is, the change of memory cell resistance Rcell which occurs in response to the application of the bias magnetic field has different polarities depending on the level of stored data. In the second embodiment, the data read operation is executed by utilizing such MTJ memory cell magnetization characteristic.

Figure 16:
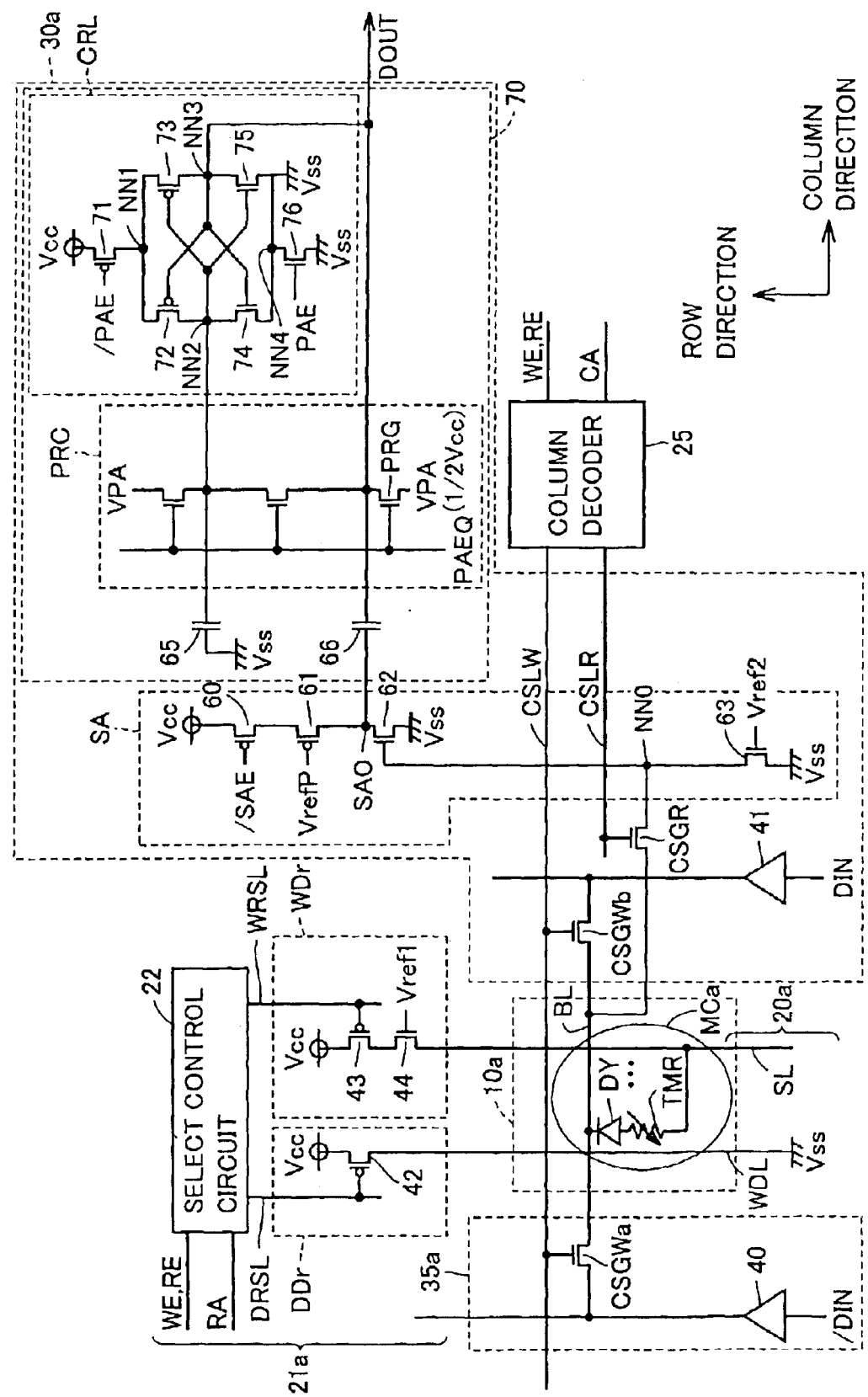
FIG. 16 is a block diagram of a circuit group for executing a data read operation and a data write operation according to the second embodiment of the present invention.

Referring to FIG. 16, a circuit group which execute a data read operation and a data write operation according to the second embodiment differs from the circuit group shown in FIG. 2 in that memory array 10 is replaced by a memory array 10a. In memory array 10a, memory cells MCa shown in FIG. 11 are arranged in a matrix, though not shown in FIG. 16. In FIG. 16, one memory cell MCa is shown by way of example.

In memory array 10a, source line SL and write digit line WDL are arranged to correspond to each memory cell row. Bit line BL is arranged to correspond to each memory cell column. Each of MTJ memory cells MCa include tunnel magneto-resistance element TMR and access diode DY which are coupled in series between corresponding bit line BL and source line SL.

Next, the circuit configuration of row select circuits 20a and 21a which execute row selection in memory array 10a will be described.

Row select circuit 20a electrically couples write digit line WDL to fixed voltage Vss.

Row select circuit 21a includes a select control circuit 22 which executes row selection in response to row address RA, control signal WE for instructing data write, and control signal RE for instructing data read, as well as a source line driver WDr and a write digit line driver DDr arranged to correspond to each row.

Select control circuit 22 activates a select line WRSL (to "L" level) during data write. In addition, select control circuit 22 activates a select line DRSL (to "L" level) during data read.

Source line driver WDr includes transistors 43 and 44. Transistors 43 and 44 are coupled in series between power supply voltage Vcc and source line SL, and the gates thereof receive the inputs of the select signal for select line WRSL and a reference signal Vref1, respectively. Reference signal Vref1 is adjusted so as to prevent source line SL from being fully rocked by reference signal Vref1. By way of example, transistor 43 is a P-channel MOS transistor, and transistor 44 is an N-channel MOS transistor.

Write digit driver DDr includes a transistor 42. Transistor 42 is arranged between power supply voltage Vcc and write digit line WDL, and the gate thereof receives the input of the select signal for select line DRSL.

Column decoder 25 selectively activates a column select line CSLW (to "H" level) in response to column address CA and control signal WE. In addition, column decoder 25 selectively activates a column select line CSLR (to "H" level) in response to column address CA and control signal RE.

Next, the configuration of read/write control circuits 30a and 35a will be described.

Read/write control circuit 35a includes a column select gate CSGWa which controls the connection of one end side of bit line BL and a write driver 40 which are provided to correspond to each memory cell column. Column select gate CSGWa electrically couples write driver 40 to bit line BL in response to the activation of column select line CSLW. Write driver 40 drives one end side of corresponding bit line BL at either power supply voltage Vcc1 or fixed voltage Vss, not shown, in accordance with input data /DIN which is an inverted signal of input data DIN.

Further, Read/write control circuit 30a includes a column select gate CSGWb and a write driver 41. Column select gate CSGWb electrically couples write driver 41 to bit line BL in response to the activation of column select line CSLW. Write driver 41 drives the other end side of corresponding bit line BL at either power supply voltage Vcc1 or fixed voltage Vss, not shown, in accordance with input data DIN.

Further, read/write control circuit 30a includes that a column select gate CSGR, sense amplifier SA, and an amplifier 70, which used for data read.

Column select gate CSGR is provided to correspond to each memory cell column, and electrically couples bit line BL to a node NN0 in response to the activation of column select line CSLR.

Sense amplifier SA converts the current change of a data read current which passes through bit line BL into a voltage change, and outputs the voltage change from a node SAO.

Sense amplifier SA includes transistors 60 to 63. Transistors 60 and 61 are provided in serial and electrically coupled between output node SAO and power supply voltage Vcc, the gates thereof receive a sense amplifier enable signal /SAE which is an inverted signal of a sense amplifier enable signal SAE which is activated during data read and a reference signal VrefP, respectively. The voltage level of the voltage generated at output node SAO of sense amplifier SA can be adjusted in response to the voltage level of reference signal VrefP. Further, transistor 62 is arranged between node SAO and fixed voltage Vss, and the gate thereof is coupled to node NN0. Transistor 63 is arranged between node NN0 and fixed voltage Vss, and the gate thereof receives the input of a reference signal Vref2. The quantity of the current which passes through transistor 63 is adjusted in response to reference signal Vref2, making it possible to adjust the response rate of sense amplifier SA.

By way of example, transistors 60 and 61 are P-channel MOS transistors, and transistors 62 and 63 are N-channel MOS transistors.

Amplifier 70 amplifies the data generated in sense amplifier SA, and outputs the amplified data as read data DOUT. Amplifier 70 includes a precharge circuit PRC, a cross latch circuit CRL, and capacitors 65 and 66.

Cross latch circuit CRL includes transistors 71 to 76. Transistor 71 is arranged between power supply voltage Vcc and a node NN1, and the gate thereof receives the input of control signal /PAE which is an inverted signal of a control signal PAE activated in a data read operation. Transistor 72 is arranged between nodes NN1 and NN2. Transistor 74 is arranged between nodes NN2 and NN4. The gates of transistors 72 and 74 are electrically coupled to a node NN3. Transistor 73 is arranged between nodes NN1 and NN3. Transistor 75 is arranged between nodes NN3 and NN4. The gates of transistors 73 and 75 are electrically coupled to node NN2. Transistor 76 is arranged between node NN4 and fixed voltage Vss, and the gate thereof receives the input of control signal PAE. By way of example, transistors 71 to 73 are P-channel MOS transistors and transistors 74 to 76 are N-channel MOS transistors.

Capacitor 66 is arranged between nodes NN3 and SA0. Capacitor 65 is arranged between node NN2 and fixed voltage Vss. Therefore, capacitor 65 holds the voltage state of node NN2.

Precharge circuit PRC includes a plurality of transistors PRG coupled in series, each of which is coupled to a power supply voltage VPA (=½ Vcc) in response to control signal PAEQ to be precharged with power supply voltage VPA and to equalize nodes NN2 and NN3.

Figure 17:
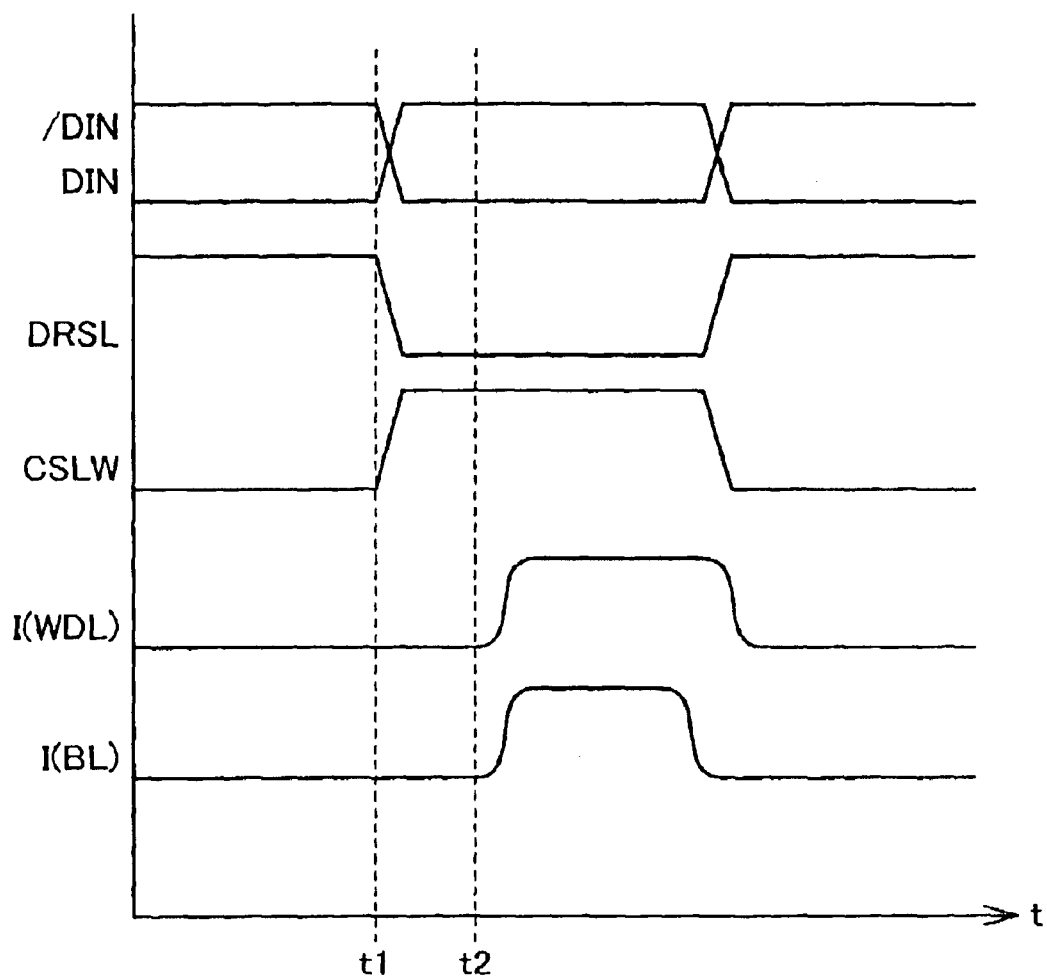
FIG. 17 is a timing chart for the data write operation in the second embodiment.

A data write operation in the second embodiment will be described with reference to the timing chart of FIG. 17.

At time t1, select control circuit 22 activates select line DRSL (to "L" level) in response to row address RA and control signal WE. Accordingly, at time t2, transistor 42 is turned on and data write current I(WDL) is supplied to write digit line WDL.

Further, column decoder 25 activates column select line CSWL (to "H" level) in response to column address CA and control signal WE. Accordingly, column select gates CSGWa and CSGWb are turned on, accordingly. Write drivers 40 and 41 and bit line BL are electrically coupled to one another, accordingly. Since input data DIN and input data /DIN are at "H" level and "L" level, respectively, write driver 41 drives bit line BL at power supply voltage Vcc1 at time t2. Write driver 40 couples the other end side of bit line BL to fixed voltage Vss. As a result, data write current I(BL) is supplied.

Data write currents I(BL) and I(WDL) enable stored data corresponding to input data DIN of a selected memory cell to be written to the selected memory cell.

A data read operation in the second embodiment will be described.

One data read operation consists of a first half period in which no bias magnetic field is applied to the selected memory cell, and a second half period in which a bias magnetic field is applied to the selected memory cell. In the second half period, write digit line driver DDr in a selected column operates in the same manner as that in the data write operation, and activates corresponding write digit line WDL. Namely, a bias magnetic field is generated by the current supplied to write digit line WDL in a selected row.

Before the bias magnetic field is applied, i.e., while no current is supplied to corresponding write digit line WDL (I(WDL)=0), node NN0 is set to have a voltage corresponding to the stored data of the selected memory cell.

Next, after the bias magnetic field is applied, i.e., while a bias current is supplied to corresponding write digit line WDL in the selected row (I(WDL)=Ip), a predetermined bias magnetic field along the hard axis direction acts on the selected memory cell. As already described, by applying such a bias magnetic field to the selected memory cell, memory cell resistance Rcell of the selected memory cell changes with a polarity according to the stored data, compared with the state before the bias magnetic field is applied thereto. As a result, the voltage of node NN0 rises or falls from that before the bias magnetic field is applied to the selected memory cell.

Specifically, if stored data (e.g., "0") corresponding to electric resistance Rcell is stored in the selected memory cell, the voltage of node NN0 after the bias magnetic field is applied to the selected memory cell is higher than that before the bias magnetic field is applied thereto. This is because the current supplied to tunnel magneto-resistance element TMR decreases as memory cell resistance Rcell increases by the action of the bias magnetic field by digit line current I(WDL). If stored data (e.g., "1") corresponding to electric resistance Rmax is stored in the selected memory cell, the voltage of node NN0 after the bias magnetic field is applied to the selected memory cell is lower than that before the bias magnetic field is applied thereto. This is because the current supplied to tunnel magneto-resistance element TMR increases as memory cell resistance Rcell decreases by the action of the bias magnetic field by digit line current I(WDL).

Figure 18:
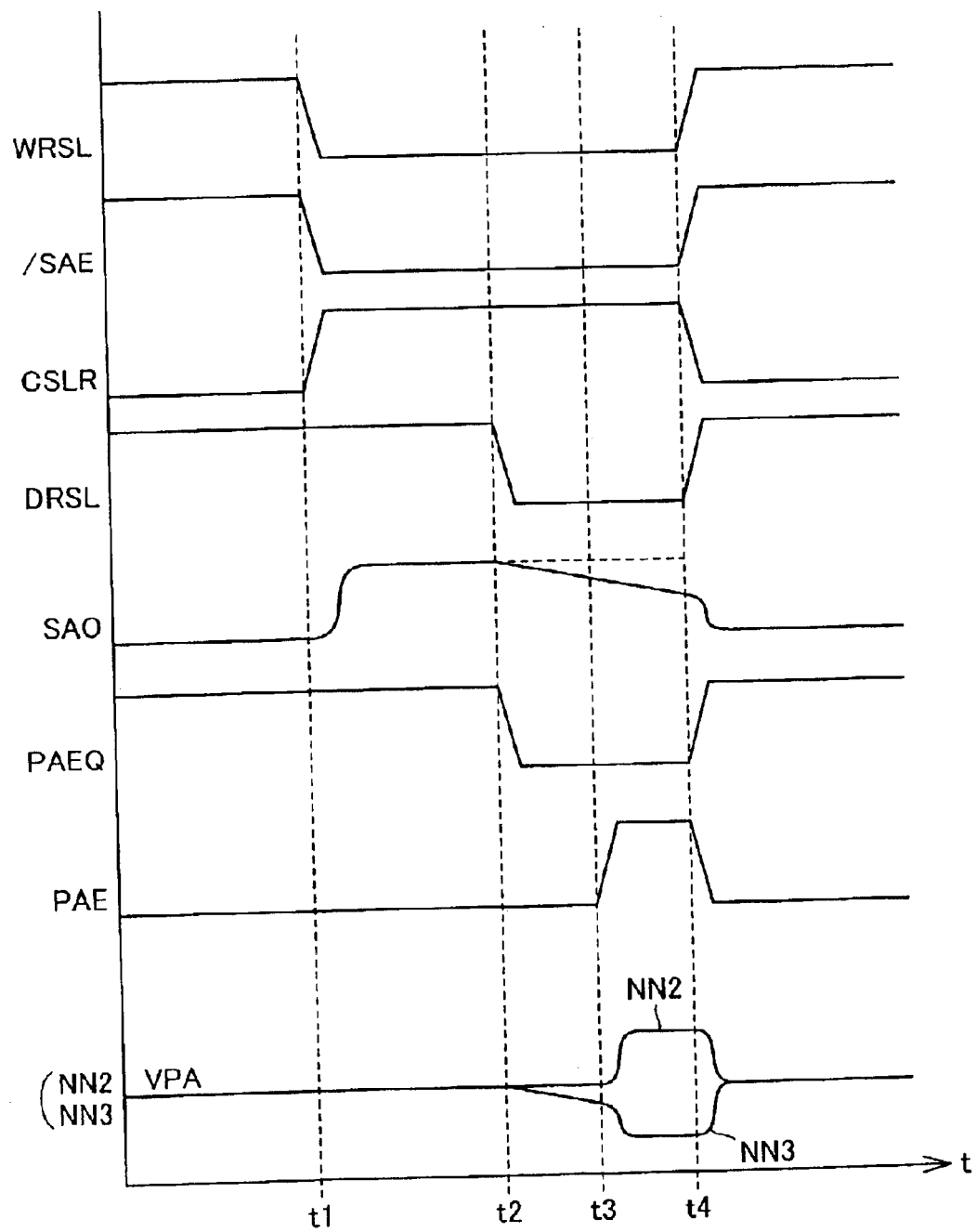
FIG. 18 is a timing chart for the data read operation in the second embodiment.

The data read operation in the second embodiment will be described with reference to the timing chart of FIG. 18.

Before the data read operation, precharge circuit PRC of amplifier 70 precharges nodes NN2 and NN3 with voltage VPA level (½ Vcc) in response to control signal PAEQ. Therefore, nodes NN2 and NN3 are set at the same voltage level.

At time t1 when data is read, select control circuit 22 activates select line WRSL (to "L" level) in response to the input of row address RA and control signal RE. Source line driver WDr is activated, accordingly, to thereby drive source line SL. In addition, at the same time, column decoder 25 activates column select line CSLR (to "H" level) in response to the input of column address CA and control signal RE. Column select gate CSGR is turned on, accordingly, to thereby electrically connect node NN0 to bit line BL. Further, sense amplifier enable signal /SAE is activated (to "L" level), whereby sense amplifier SA turns into an operative state.

Accordingly, a current path is formed from source line SL to sense amplifier SA through a selected memory cell. In sense amplifier SA, a pass current which passes through sense amplifier SA is converted into a voltage and a voltage signal at predetermined voltage level is generated at node SA0. At this time, control signal PAEQ is at "H" level, so that nodes NN2 and NN3 are set at power supply voltage VPA level. As a result, output signal DOUT at certain level (power supply voltage VPA level) is constantly outputted from node NN3.

Next, at time t2, select control circuit 22 activates select line DRSL (to "L" level). Accordingly, write digit line driver DDr is activated, whereby a bias current equal to data write current Ip is gradually carried to write digit line WDL in a selected row while source line SL in the selected row is kept active (at "H" level). That is, a bias magnetic field is gradually applied to the selected memory cell. Accordingly, the voltage of bit line BL in a selected column changes (rises or falls) with a polarity according to the level of the stored data of the selected memory cell. Further, at the same time, precharge circuit PRC sets control signal PAEQ at "L" level. Accordingly, nodes NN2 and NN3 are electrically disconnected from each other.

Now, amplifier 70 which receives the output of sense amplifier SA will be considered.

If a bias magnetic field is applied to the selected memory cell, the current which passes through sense amplifier SA changes according to the change of memory cell resistance Rcell. Accordingly, the voltage level of node SAO changes, and the changed voltage level is transmitted to node NN3 by capacitor 66. Therefore, the voltage difference with a polarity according to the stored data of the selected memory cell is generated between nodes NN2 and NN3.

At time t3 when this voltage difference is sufficiently generated, control signal PAE is activated (to "H" level). Accordingly, cross latch circuit CRL amplifies the voltage difference between nodes NN2 and NN3, and outputs read data DOUT from node NN3.

It is noted that the bias magnetic field applied to the selected memory cell by the bias current (data write current Ip) supplied to write digit line WDL does not invert the magnetic direction of tunnel magneto-resistance element TMR. Therefore, at time t4 when the data read operation is finished and the bias magnetic field is eliminated, the magnetic direction of the selected memory cell returns to the same state as that before the data read operation.

As can be seen, the data read operation according to the second embodiment of the present invention is a nondestructive read operation. Due to this, it is unnecessary to perform a data rewrite operation as seen in the described self-reference read operation.

Furthermore, according to the data read operation in the second embodiment, forced data write and data read operations and a rewrite operation following the destruction of the stored data of the selected memory cell are unnecessary in one data read operation. It is, therefore, possible to execute the self-reference read operation at high rate.

Moreover, by employing memory cell MCa in the second embodiment, the current supplied to write digit line WDL used in the data write operation is used as a bias current for generating a bias magnetic field. It is thereby possible to simplify circuit configuration without arranging a new circuit for supplying the bias current in the data read operation.

The data write operation and data read operation which have been described in the second embodiment can be similarly applied to memory cell MC and memory cell MC# shown in FIGS. 7 and 8.

Modification of Second Embodiment

Figure 19:
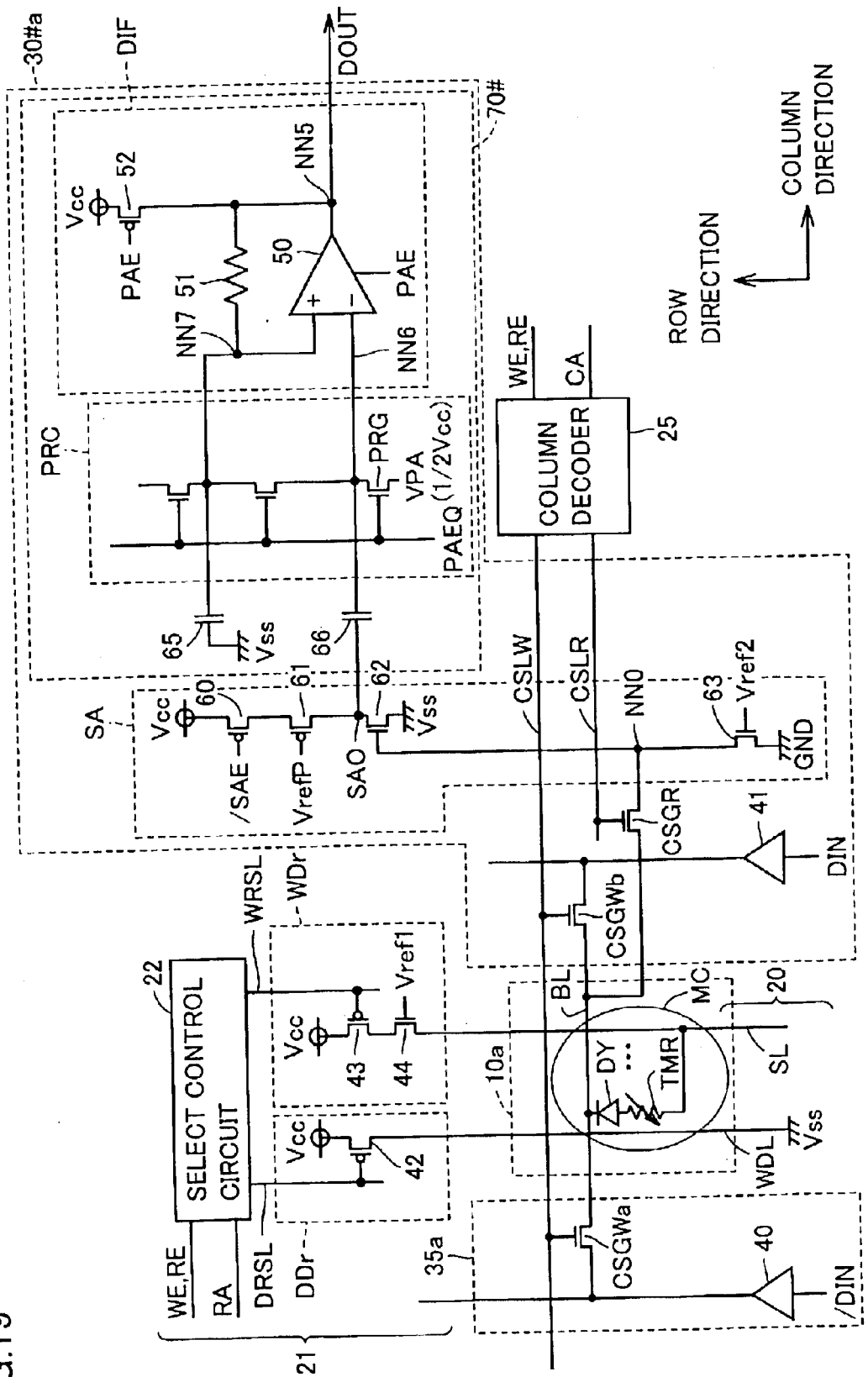
FIG. 19 is a block diagram of a circuit group for executing a data read operation and a data write operation according to a modification of the second embodiment of the present invention.

Referring to FIG. 19, a circuit group which execute a data read operation and a data write operation according to a modification of the second embodiment of the present invention differs from the circuit group in the second embodiment in that read/write control circuit 30a is replaced by a read/write control circuit 30#a.

Read/write control circuit 30#a differs from read/write control circuit 30a in that amplifier 70 is replaced by amplifier 70#. Since the other constituent elements of read/write control circuit 30#a are the same as those of read/write control circuit 30a shown in FIG. 16, they will not be repeatedly described herein in detail.

Amplifier 70# includes a differential circuit DIF which amplifies the degree of the change of an input signal, precharge circuit PRC, and capacitors 65 and 66.

Differential circuit DIF includes an operational amplifier 50, a resistance 51, and a transistor 52. Operational amplifier 50 is activated in response to control signal PAE, and outputs an output signal to a node NN5 in accordance with input signals from nodes NN6 and NN7. Resistance 51 is provided between nodes NN5 and NN7. P-channel MOS transistor 52 is arranged between power supply voltage Vcc and node NN5, and receives the input of control signal PAE. Therefore, if control signal PAE is at "L" level, power supply voltage Vcc is electrically coupled to node NN5, so that data signal DOUT at certain level is constantly outputted from node NN5. Capacitor 65 is arranged between node NN7 and fixed voltage Vss. Accordingly, capacitor 65 holds the voltage state of node NN7. Further, capacitor 66 is arranged between nodes SAO and NN6.

Precharge circuit PRC includes a plurality of transistors PRG coupled to one another in series, each of which is coupled to power supply voltage VPA (=½ Vcc) and precharged with power supply voltage VPA in response to control signal PAEQ to thereby equalize nodes NN6 and NN7.

Figure 20:
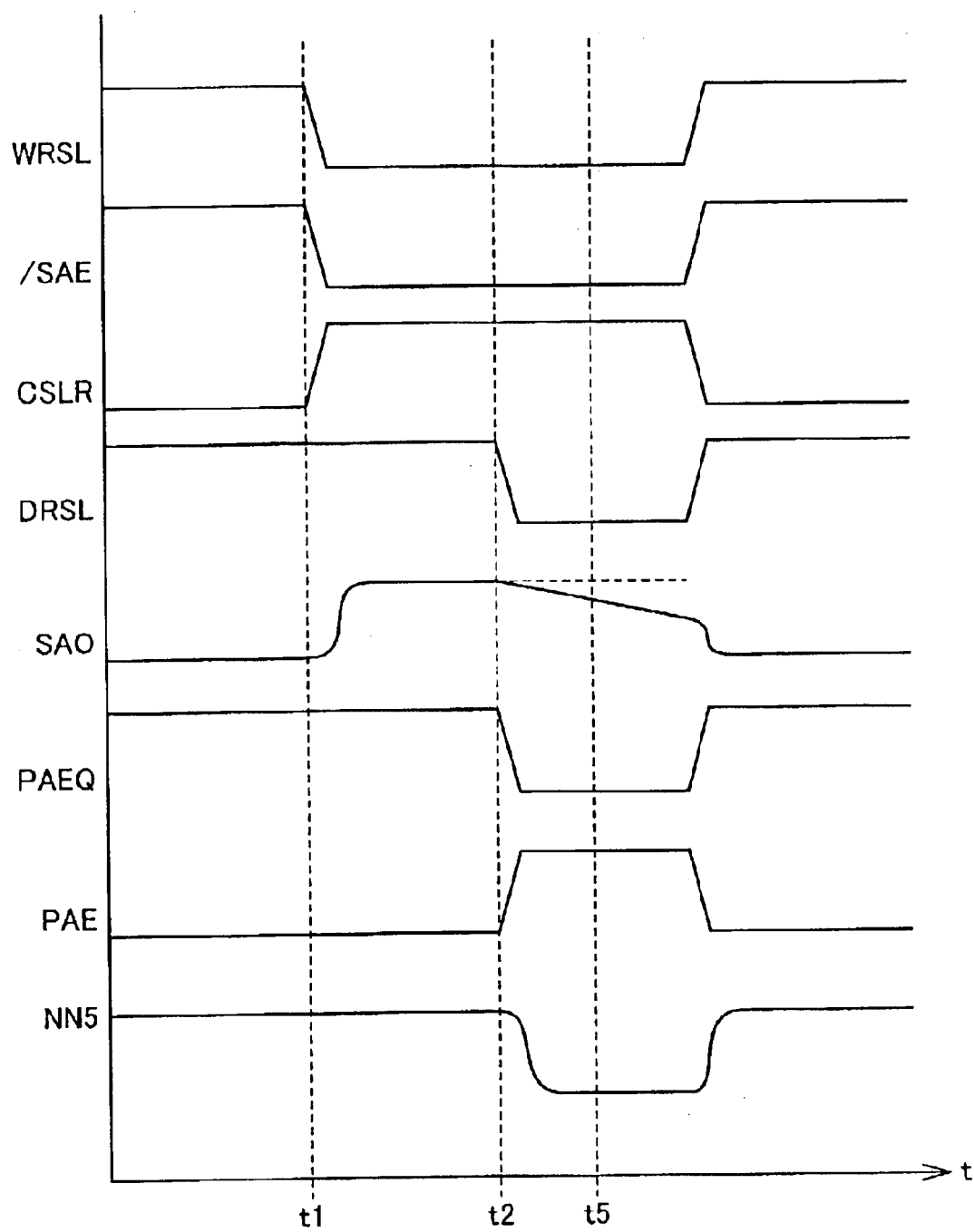
FIG. 20 is a timing chart for the data read operation in the modification of the second embodiment.
Figure 21:
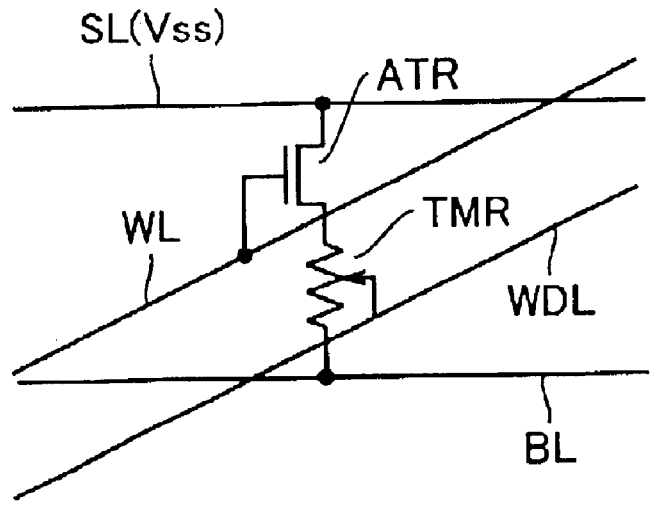
FIG. 21 is a schematic diagram showing the configuration of a memory cell having a tunnel junction.
Figure 22:
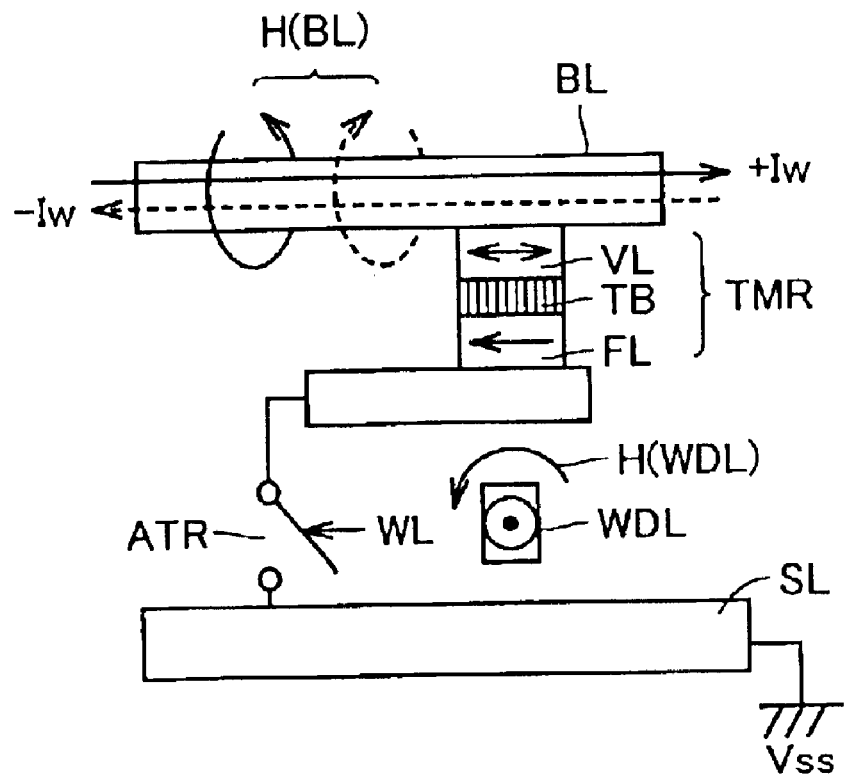
FIG. 22 is a conceptual view for describing a data write operation to an MTJ memory cell.
Figure 23:
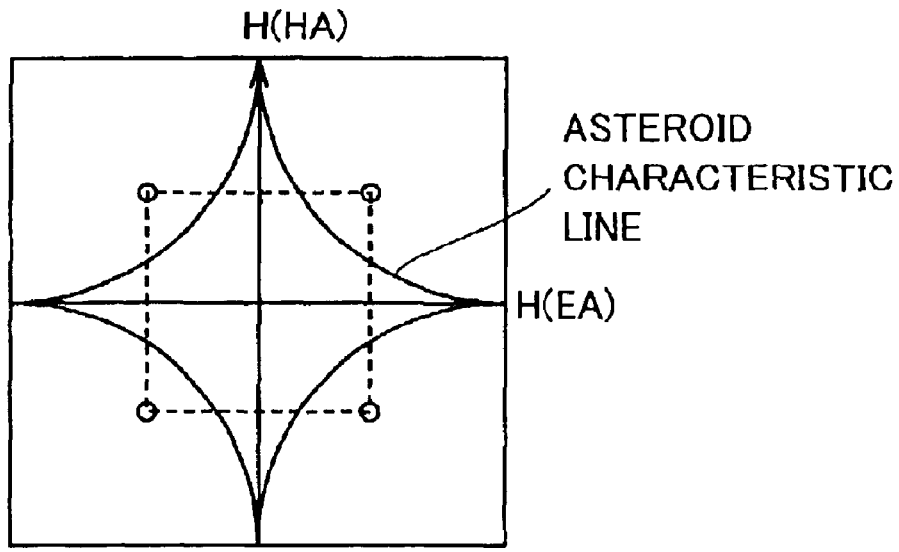
FIG. 23 is conceptual view showing the relationship between a data write current and the magnetic direction of a tunnel magneto-resistance element during data write.
Figure 24:
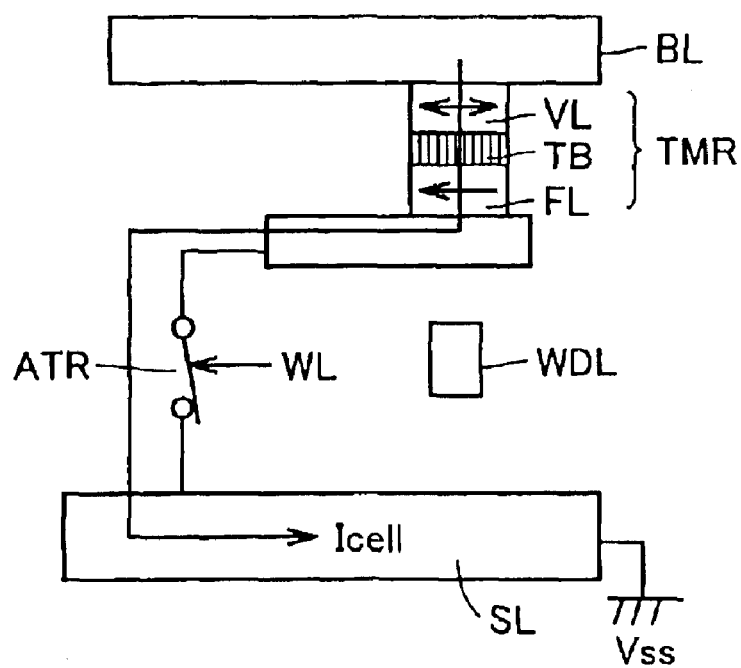
FIG. 24 is a conceptual view for describing a data read operation for reading data from an MTJ memory cell.
Figure 25:
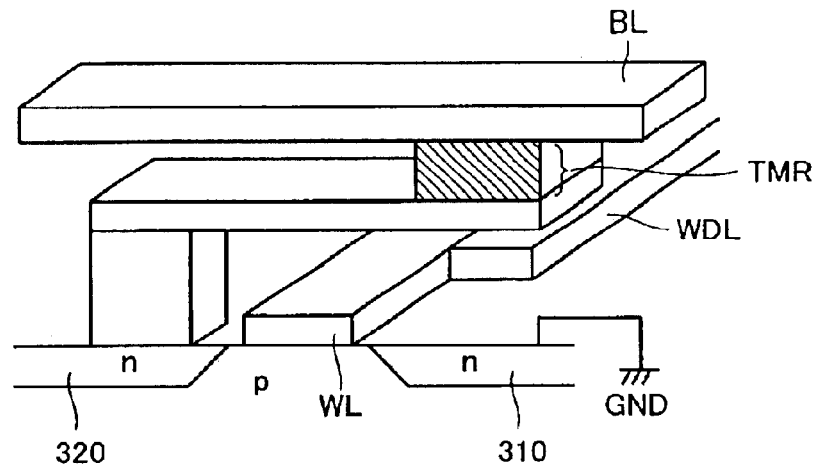
FIG. 25 is a block diagram of an MTJ memory cell which uses an access transistor.

A data read operation in the modification of the second embodiment will be described with reference to the timing chart of FIG. 20.

Since the periods from time t1 when a data read operation starts until time t2, are the same as those of the data read operation in the second embodiment, they will not be repeatedly described herein in detail.

At time t2, select control circuit 22 activates select line DRSL (to "L" level). Accordingly, write digit line driver DDr is activated, and a bias current equal to data write current Ip is gradually carried to write digit line WDL in a selected row while source line SL in the selected row is kept active (at "H" level). Namely, a bias magnetic field is gradually applied to a selected memory cell. Accordingly, the voltage of bit line BL in a selected column changes (rises or falls) with a polarity according to the stored data of the selected memory cell. At the same time, the level of control signal PAEQ becomes "L", and precharge circuit PRC is deactivated. Accordingly, nodes NN6 and NN7 are electrically disconnected from each other. Further, at the same time, control signal PAE is activated (to "H" level), whereby sense amplifier SA turns into an operative state.

Now, amplifier 70# which receives the output of sense amplifier SA will be considered.

If a bias magnetic field is applied to the selected memory cell, the current which passes through sense amplifier SA changes according to the change of memory cell resistance Rcell. Accordingly, the voltage level of node SAO changes, and the changed voltage level is transmitted to node NN6 by capacitor 66. The voltage difference with a polarity according to the stored data of the selected memory cell is generated between nodes NN6 and NN7. Operational amplifier 50 amplifies the voltage difference, and outputs the amplified voltage signal to node NN5 as read data.

In the data read operation in the second embodiment, cross latch circuit CRL is activated when some voltage difference is generated between nodes NN2 and NN3 of cross latch circuit CRL. In the modification of the second embodiment, before the voltage difference is generated between nodes NN6 and NN7, differential circuit DIF is activated and read data is amplified.

That is, in the modification of the second embodiment, by employing differential circuit DIF, it is possible to amplify the degree of voltage change of node NN6. Therefore, good sensitivity can be ensured and the activation timing for activating operational amplifier 50 can be advanced. It is thereby possible to shorten data read period.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:

a plurality of memory cells each having an electric resistance according to a magnetic direction;

a data line electrically coupled to a fixed voltage through a selected memory cell selected as a data read target among said plurality of memory cells during data read;

a current supply circuit coupling said data line to a predetermined voltage for supplying a data read current to said selected memory cell at least during said data read;

a data write circuit applying a data write magnetic field to said selected memory cell; and a data read circuit generating read data on the basis of stored data of said selected memory cell before and after application of said data write magnetic field, application of said data write magnetic field being executed at least once within one data read operation, wherein said data read circuit includes:

a voltage holding section holding a voltage of said data line applied by performing a read operation from said selected memory cell before the application of said data write magnetic field in an internal node; and a voltage comparison section generating said read data in accordance with comparison between the voltage of said data line applied by performing the read operation from said selected memory cell after application of said data write magnetic field and a voltage of said internal node, and wherein, said read operation to said selected memory cell before the application of said data write magnetic field, said application of said data write magnetic field, and said read operation to said selected memory cell after the application of said data write magnetic field are continuously executed.

2. The thin film magnetic memory device according to claim 1, wherein said thin film magnetic memory device operates synchronously with a clock signal, and within said one data read operation, said read operation to said selected memory cell before the application of said data write magnetic field and said application of said data write magnetic field are continuously executed in one clock cycle period.

3. The thin film magnetic memory device according to claim 1, wherein the stored data of said selected memory cell before the application of said data write magnetic field is in a first state, and said stored data of said selected memory cell after the application of said data write magnetic field is set at one of said first state and a second state.

4. The thin film magnetic memory device according to claim 1, wherein said voltage comparison section generates said read data on the basis of a voltage difference of the voltage of said internal node applied by said read operation executed first with reference to the voltage of said data line applied by performing said read operation from said selected memory cell after the application of said data write magnetic field.

5. The thin film magnetic memory device according to claim 1, wherein said plurality of memory cells are arranged in a matrix, said thin film magnetic memory device further comprises:

a plurality of word lines provided to correspond to rows of said memory cells, respectively, each of said memory cells further has a switch element allowing said data read current to pass through in accordance with activation of corresponding one of said plurality of word lines, and the word line corresponding to said selected memory cell is kept active in said one data read operation.

6. The thin film magnetic memory device according to claim 1, wherein said data write control circuit performs a rewrite operation for writing data equal in level to said generated read data, to said selected memory cell within said one data read operation.

7. The thin film magnetic memory device according to claim 6, wherein said data write control circuit stops said rewrite operation when the stored data of said selected memory cell just before executing said rewrite operation is equal in level to said generated read data.

8. A thin film magnetic memory device comprising:

a plurality of memory cells arranged in a matrix, and each including a magneto-resistance element having an electric resistance according to a magnetic direction;

a plurality of source lines provided to correspond to rows of said memory cells, respectively; and a plurality of bit lines provided to correspond to columns of said memory cells, respectively, wherein each of said memory cells is arranged between the corresponding source line and the corresponding bit line without using an access element, said thin film magnetic memory device further comprises:

a data line electrically coupled to the bit line corresponding to a selected memory cell selected as a data read target among said plurality of memory cells during data read;

a current supply circuit coupling the source line corresponding to said selected memory cell to a predetermined voltage and coupling the other source lines to a fixed voltage other than said predetermined voltage during said data read;

a data write circuit applying a data write magnetic field to said selected memory cell; and a data read circuit generating read data on the basis of stored data of said selected memory cell before and after application of said data write magnetic field, application of said data write magnetic field being executed at least once within one data read operation, and said data read circuit includes:

a voltage holding section holding a voltage of said data line applied by performing a read operation from said selected memory cell before said data write magnetic field is applied, in an internal node; and a voltage comparison section generating said read data in accordance with comparison between the voltage of said data line applied by performing the read operation from said selected memory cell after the application of said data write magnetic field, and a voltage of said internal node.

9. A thin film magnetic memory device comprising:

a plurality of memory cells arranged in a matrix, each memory cell, being magnetized along an easy axis in a direction according to magnetically written stored data, including a magneto-resistance element having an electric resistance according to a magnetic direction;

a plurality of source lines provided to correspond to rows of said memory cells, respectively; and a plurality of bit lines provided to correspond to columns of said memory cells, respectively, wherein each of said memory cells is arranged between the corresponding source line and the corresponding bit line without using an access element, said thin film magnetic memory device further comprises:

a data line electrically coupled to the bit line corresponding to a selected memory cell selected as a data read target among said plurality of memory cells during data read;

a current supply circuit coupling the source line corresponding to said selected memory cell to a predetermined voltage and coupling the other source lines to a fixed voltage other than said predetermined voltage during said data read;

a bias magnetic field application section applying a bias magnetic field along a hard axis to said selected memory cell; and a data read circuit generating read data according to stored data of said selected memory cell during said data read, on the basis of voltages of said data line before and after application of said bias magnetic field, respectively.

10. The thin film magnetic memory device according to claim 9, wherein said data read circuit includes:

a sense circuit converting a current change of said data line between before and after application of said bias magnetic field, into a voltage change;

a coupling capacitor provided between said sense circuit and an internal node, and transmitting said voltage change between before and after application of said bias magnetic field to said internal node; and an amplification section amplifying said voltage change transmitted to said internal node, for generating said read data.

11. The thin film magnetic memory device according to claim 10, wherein said amplification section includes:

a voltage transmission section setting a voltage of said internal node equal in level to a sub-internal node before the application of said bias magnetic field during said data read;

a voltage holding section holding the voltage of said sub-internal node; and a voltage amplifier amplifying a voltage difference between said internal node after the application of said bias magnetic field and said sub-internal node for generating said read data.

12. The thin film magnetic memory device according to claim 10, wherein said amplification section includes:

a voltage transmission section setting a voltage of said internal node equal in level to a sub-internal node before the application of said bias magnetic field during said data read;

a voltage holding section holding the voltage of said sub-internal node; and a differential circuit amplifying a degree of the voltage change transmitted to said internal node, on the basis of the voltage of said sub internal node for generating said read data to output node.

13. The thin film magnetic memory device according to claim 9, wherein each of said memory cells further includes a diode element provided between said corresponding bit line and said corresponding source line through said magneto-resistance element, said thin film magnetic memory device further comprises a plurality of digit lines provided to correspond to the rows of the memory cells, respectively, and each of said digit lines corresponds to said bias magnetic field application section.

14. The thin film magnetic memory device according to claim 13, wherein said data read circuit includes:

a sense circuit converting a current change of said data line between before and after application of said bias magnetic field into a voltage change;

a coupling capacitor provided between said sense circuit and an internal node, and transmitting said voltage change between before and after application of said bias magnetic field, to said internal node; and an amplification section amplifying said voltage change transmitted to said internal node, for generating said read data.

15. The thin film magnetic memory device according to claim 14, wherein said amplification section includes:

a voltage transmission section setting a voltage of said internal node equal in level to a sub-internal node before the application of said bias magnetic field during said data read;

a voltage holding section holding the voltage of said internal node; and a voltage amplifier amplifying a voltage difference between said internal node after the application of said bias magnetic field and said sub-internal node for generating said read data.

16. The thin film magnetic memory device according to claim 14, wherein said amplification section includes:

a voltage transmission section setting the voltage of said internal node equal in level to a sub-internal node before the application of said bias magnetic field during said data read;

a voltage holding section holding the voltage of said sub-internal node; and a differential circuit amplifying a degree of the voltage change transmitted to said internal node on the basis of the voltage of said sub-internal node for generating said read data to said output node.

* * * * *